United States Patent
Chao et al.

(10) Patent No.: US 7,298,798 B1
(45) Date of Patent: Nov. 20, 2007

(54) METHOD AND SYSTEM FOR DECODING BLOCK CODES

(75) Inventors: Chi Chao Chao, Hsinchu (TW); Mao Ching Chiu, Hsinchu (TW)

(73) Assignee: Mediatek, Inc., Hsin-Chu (TW)

(*) Notice: Subject to any disclaimer, the term of this patent is extended or adjusted under 35 U.S.C. 154(b) by 751 days.

(21) Appl. No.: 10/227,080

(22) Filed: Aug. 21, 2002

Related U.S. Application Data

(60) Provisional application No. 60/395,288, filed on Jul. 12, 2002, provisional application No. 60/314,757, filed on Aug. 24, 2001.

(51) Int. Cl.
  *H03D 1/00* (2006.01)
  *H04L 27/06* (2006.01)
  *H03M 3/00* (2006.01)

(52) U.S. Cl. ............... 375/341; 375/240.24; 375/262; 375/265; 341/143

(58) Field of Classification Search ........... 375/240.24, 375/262, 265, 316, 341, 240.1, 240.11; 341/143; 455/102, 130, 91
See application file for complete search history.

(56) References Cited

U.S. PATENT DOCUMENTS

| | | | | |
|---|---|---|---|---|
| 5,014,275 A | * | 5/1991 | Shimoda et al. | 714/791 |
| 5,301,209 A | * | 4/1994 | Wei | 375/265 |
| 5,323,424 A | * | 6/1994 | Fazel et al. | 375/329 |
| 5,434,886 A | * | 7/1995 | Kazawa et al. | 375/262 |
| 5,497,384 A | * | 3/1996 | Fredrickson et al. | 714/792 |
| 5,717,471 A | * | 2/1998 | Stewart | 348/726 |
| 5,841,813 A | | 11/1998 | van Nee | |
| 5,862,182 A | | 1/1999 | Awater et al. | |

(Continued)

FOREIGN PATENT DOCUMENTS

EP 0413 505 A1 2/1991

(Continued)

OTHER PUBLICATIONS

Halford, Karen et al., "Complementary Code Keying for Rake-Based Indoor Wireless Communication," *Proceedings of the 1999 IEEE International Symposium on Circuits and Systems*, Orlando, Florida, May 30-Jun. 2, 1999, vol. 4 of 6, pp. 427-430.

(Continued)

*Primary Examiner*—David C. Payne
*Assistant Examiner*—Linda Wong
(74) *Attorney, Agent, or Firm*—Thomas, Kayden, Horstemeyer & Risley

(57) ABSTRACT

A method and system are disclosed for decoding block codes using a single decoder and trellis diagram. The signal can include at least one block code, and the block code can be modulated using at least one of a plurality of modulation modes. The block code contained in the signal can be selectively decoded based on the modulation mode for the block code using a trellis diagram corresponding to the modulation mode for the block code, for example, a low and high-rate CCK modulation mode or a differential quadrature phase shift keying (DQPSK) Baker sequence modulation mode and a differential binary phase shift keying (DBPSK) Barker sequence modulation mode. The trellis diagram can have multiple embedded subtrellis diagrams in the trellis diagram. In this manner, multiple types of block codes and be decoded using a single decoder and trellis diagram.

28 Claims, 11 Drawing Sheets

U.S. PATENT DOCUMENTS

| | | | |
|---|---|---|---|
| 5,875,001 A * | 2/1999 | Kwak | 348/607 |
| 6,005,840 A | 12/1999 | Awater et al. | |
| 6,141,384 A * | 10/2000 | Wittig et al. | 375/240.25 |
| 6,233,273 B1 | 5/2001 | Webster et al. | |
| 6,233,286 B1 * | 5/2001 | Wei | 375/265 |
| 6,269,129 B1 * | 7/2001 | Rhee et al. | 375/341 |
| 6,301,209 B2 * | 10/2001 | Fujinami | 369/47.15 |
| 6,324,224 B1 * | 11/2001 | Ikeda | 375/341 |
| 6,327,317 B1 * | 12/2001 | Chennakeshu et al. | 375/341 |
| 6,734,920 B2 * | 5/2004 | Ghosh et al. | 348/614 |
| 6,907,084 B2 * | 6/2005 | Jeong | 375/261 |
| 2003/0231709 A1 * | 12/2003 | Pare et al. | 375/233 |

FOREIGN PATENT DOCUMENTS

EP        1148 677 A2     10/2001

OTHER PUBLICATIONS

"Part 11: Wireless LAN Medium Access Control (MAC) and Physical Layer (PHY) specifications: Higher-Speed Physical Layer Extension in the 2.4 GHz Band," *IEEE Standard 802.11B-1999 (Supplement to ANSI/IEEE Standard 802.11, 1999 Edition)*, The Institute of Electrical and Electronics Engineers, Inc., New York, New York, published Jan. 20, 2000, pp. 1-89.

Pearson, Bob, "Complementary Code Keying Made Simple," *Intersil*™, Application Note 9850, 2001, pp. 1-6.

Sun, Jian, "Complementary Code Keying Modulation," (http://www.csee.wvu.edu/~jian/ck.htm, Lane Department of Electrical Engineering, West Virginia University, printed Jun. 24, 2002, 3 pages.

Swaminathan, Sriram et al., "A Dynamically Reconfigurable Adaptive Viterbi Decoder," Department of Electrical and Computer Engineering, University of Massachusetts, Amherst, MA, *FPGA '02*, Feb. 24-26, 2002, 10 pages.

Viterbi, Andrew J., "Error Bounds for Convolutional Codes and an Asymptotically Optimum Decoding Algorithm," *IEEE Transactions on Information Theory*, vol. IT-13, No. 2, Apr. 1967, pp. 260-269.

Viterbi Decoder Coprocessor User's Guide, Texas Instruments, Inc., copyright © 2001, pp. 1-36.

\* cited by examiner

METHOD AND SYSTEM FOR DECODING BLOCK CODES

RELATED APPLICATIONS

This application claims priority to U.S. Provisional Application No. 60/314,757, entitled "METHOD AND APPARATUS FOR A COMMUNICATION SYSTEM USING COMPLEMENTARY CODE KEYING AND BARKER SEQUENCE MODULATION," filed on Aug. 24, 2001, and to U.S. Provisional Application No. 60/395,288, entitled "METHOD AND SYSTEM FOR DECODING CCK CODEWORDS BY CALCULATING A BRANCH METRIC ACCORDING TO A DECISION FEEDBACK SEQUENCE ESTIMATION ALGORITHM," filed on Jul. 12, 2002, which are hereby expressly incorporated by reference. This application is also related to U.S. Patent Application Ser. No. 10/227,093, entitled "METHOD AND SYSTEM FOR DECODING BLOCK CODES BY CALCULATING A PATH METRIC ACCORDING TO A DECISION FEEDBACK SEQUENCE ALGORITHM," filed on Aug. 21, 2002, which is hereby expressly incorporated herein by reference and commonly owned by the same assignee of this application.

FIELD

This invention relates generally to wireless communications and, more particularly, to a method and system for decoding block codes.

BACKGROUND

The wide spread use of wireless devices in a network environment has increased the demand for wireless local area networks ("WLANs") to provide high data rates at low cost. Complementary Code Keying (CCK) is one communication technique that can be used to meet this demand. CCK uses complementary polyphase codes for modulating digital information, which has been adopted by IEEE 802.11b as the modulation scheme for WLANs operating at 5.5 Mbit/s and 11 Mbit/s data rates in a 2.4 GHz band. These types of codes provide complementary sequences ("symbols") having phase parameters, and possess symmetry ideal for transmitting digital information. Typically, at a high data rate of 11 Mbit/s, the codes are grouped as "codewords" having 8-chips or a code length of 8. These codewords are a type of block code ("block codewords"). In this case, 256 possible combinations of codewords may be used. Communication systems can thus extract digital information from a received signal modulated with CCK codewords by decoding the CCK codewords.

One prior complementary code decoder is described in U.S. Pat. Nos. 5,841,813 to van Nee and 5,862,182 to Awater et al., which extracts information data of a CCK codeword by correlating different samples of the received signal. For such a decoder, the signal-to-noise ratios degrade significantly after the differential correlators. Additionally, the decoder is not applicable for transmission of CCK codes in multipath environments.

One possible decoding scheme for block codes is to match the received signal with all possible code patterns by correlators. A disadvantage of such a decoding scheme is that its complexity increases if the size of the block code is too large. Furthermore, this is an inefficient manner of decoding block codes such as CCK code. A low-complexity decoder for CCK was introduced by M. Webster and C. Andren, Harris/Lucent CCK description: additional cover code and fast transform detail, IEEE 802.11-98/331, September 1998, in which only a subset of CCK codewords are required to be correlated with the received signal by using a fast Walsh transform. However, this type of low-complexity decoder does not adequately address the problems caused by interference in multipath environments when decoding CCK codes.

For instance, in multipath environments such as inside an office building, the delay spread of a received signal can cause interference during decoding of CCK codes and symbols within each CCK codeword contained in the received signal. In particular, multipath distortion caused by signals being reflected off of walls within the building can result in propagation delay of the received signal. This type of distortion or interference regarding CCK codewords is referred to as inter-symbol interference (ISI). Two types of ISI can occur: inter-codeword interference and intra-codeword interference. Inter-codeword interference is signal interference between codewords. Intra-codeword interference is signal interference between symbols within a codeword.

One prior receiver is described in U.S. Pat. No. 6,233,273 to Webster et al. that deals with inter-codeword and intra-codeword interference. This receiver is a channel-matched correlation receiver ("RAKE") that uses a decision feedback equalizer to mitigate the effects of multipath distortion. A disadvantage of this receiver is that it requires high signal-to-noise ratios, but a low-signal-to-noise ratios error propagation in the decision feedback equalizer causes chip errors to occur in bursts. This degrades the reliability of decoding CCK codewords. Thus, to handle low signal-to-noise ratios, the RAKE receiver is required to examine all received codeword chips prior to making a codeword decision, which is an inefficient manner of decoding CCK codewords.

One prior decoding technique has been introduced to decode and correct errors found in a signal encoded by a convolutional code. Convolutional code, unlike CCK codewords, is a continuous stream of data such as satellite data. This technique is commonly referred to as "Viterbi Decoding" that uses a trellis diagram to find a maximum-likelihood path recursively over the trellis diagram to decode convolutional data, as described in A. J. Viterbi, Error bounds for convolutional codes and an asymptotically optimum decoding algorithm, IEEE Transactions on Information Theory, vol. IT-13, pp. 260-269, April 1967.

Thus, what is needed is a block code decoder that can use Viterbi decoding techniques in order to reduce the computational complexity for decoding block codes and to handle multipath distortion in multipath environments or on multiple types of channels.

SUMMARY

According to one aspect of the invention, a method is disclosed for processing a signal containing at least one block code. The block code is modulated using at least one of a plurality of modulation modes in the received signal. The block code contained in the signal is selectively decoded based on the modulation mode for the block code using a trellis diagram corresponding to the modulation mode for the block code.

According to another aspect of the invention, a communication system is disclosed comprising a receiver and a decoder. The receiver receives a signal containing at least one block code. The block code is modulated using at least one of a plurality of modulation modes. The decoder selectively decodes the block code contained in the signal based on the modulation mode for the block code using a trellis diagram corresponding to the modulation mode of the block code.

According to another aspect of the invention, a method for processing a signal is disclosed in which a signal is received. The signal includes at least one codeword modulated therein. The codeword is decoded by using a trellis diagram having a plurality of subtrellis diagrams, wherein the decoding includes deriving a codeword candidate for each of the subtrellis diagrams, and selecting one of the derived codeword candidates as the decoded codeword.

According to another aspect of the invention, a communication device is disclosed for processing a signal comprising a receiver and a decoder. The receiver receives the signal including at least one codeword modulated therein. The decoder decodes the codeword by using a trellis diagram having a plurality of subtrellis diagrams. The decoder includes a plurality of subdecoding units to derive a codeword candidate for each of the subtrellis diagrams and to select one of the derived codeword candidates as the decoded codeword.

According to another aspect of the invention, a method is disclosed for processing a signal in which a signal is received that includes at least one codeword modulated therein. A decoding mode is selected for the codeword. The decoding mode is based on a plurality of modulation modes for the codeword. The codeword is decoded based on the selected decoding mode using a trellis diagram based on the selected decoding mode.

According to another aspect of the invention, an apparatus is disclosed comprising a receiver and a decoder. The receiver codeword data. The decoder is selectively configurable to decode the codeword data in at least one of a low-rate CCK modulation mode, high-rate CCK modulation mode, differential quadrature phase shift (DQPSK) Barker sequence modulation mode, and differential binary phase shift keying (DBPSK) Barker sequence modulation mode.

According to another aspect of the invention, a receiver is disclosed for processing a signal in a CCK modulation mode comprising a plurality of processing structures for receiving codeword data contained in the signal and deriving from the codeword data a plurality of respective codewords from respective subtrellis diagrams within a single trellis diagram. The receiver also includes a selecting circuit for selecting one of the plurality of the respective codewords as a decoded codeword output.

According to another aspect of the invention, a method of processing data in a system employing a CCK modulation scheme is disclosed. For the method, a first plurality of codewords is produced in a high-rate CCK modulation mode. A second plurality of codewords is produced in a low-rate CCK modulation mode, and a codeword output is obtained from at least one of the first and the second plurality of codewords.

According to another aspect of the invention, an apparatus for processing data in a system employing a CCK modulation scheme is disclosed comprising a first circuit, second circuit, and a selector. The first circuit produces a first plurality of codewords in a high-rate CCK modulation mode. The second circuit produces a plurality of codewords in a low-rate CCK modulation mode. The selector obtains a desired codeword output in response to at least one of: 1) the first plurality of codewords and 2) the second plurality of codewords.

According to another aspect of the invention, a method of processing a signal in a selected CCK modulation mode is disclosed. For the method, a signal is received to be processed. The received signal is processed in the selected CCK modulation mode utilizing a CCK trellis diagram for representing a plurality of associated CCK codewords of the signal, and wherein a selected one of the plurality of associated CCK codewords is represented as a path in the CCK trellis.

Other features and advantages of the invention will be apparent from the accompanying drawings, and from the detailed description, which follows below.

BRIEF DESCRIPTION OF THE DRAWINGS

The accompanying drawings, which are incorporated in, and constitute a part of, this specification illustrate exemplary implementations of the invention and, together with the detailed description, server to explain the principles of the invention. In the drawings.

DETAILED DESCRIPTION

Figure 1:
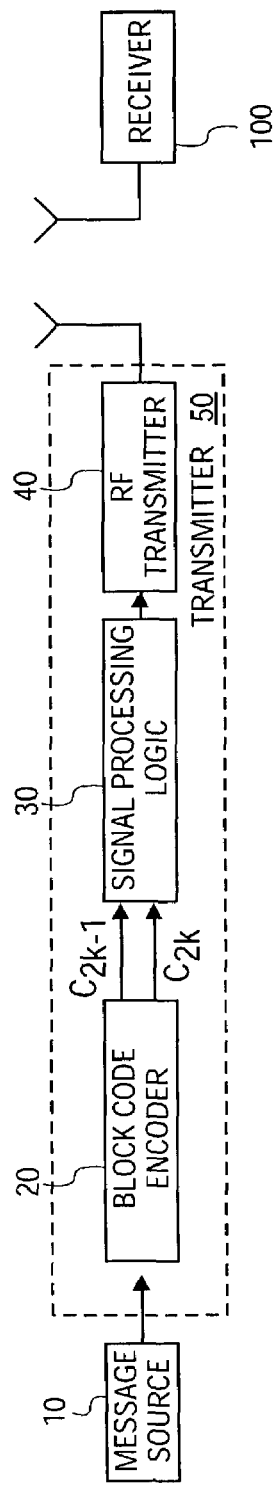
FIG. 1 illustrates an exemplary block diagram of a transmitter and receiver in which the invention can be implemented.

Reference will now be made in detail to implementations of the invention, examples of which are illustrated in the accompanying drawings. Wherever possible, the same reference numbers will be used throughout the drawings to refer to the same or like parts.

The following implementations allow block codes contained in signal to be decoded using a single decoder and trellis diagram. The signal can include at least one block code, and the block code can be modulated using at least one of a plurality modulation modes. The block code contained in the signal can be selectively decoded based on the modulation mode for the block code using a trellis diagram corresponding to the modulation mode for the block code. For example, the modulation mode can be a low and high-rate CCK modulation mode or a DQPSK Barker sequence modulation mode and a DBPSK Barker sequence modulation mode. In this manner, multiple types of block codes can be decoded using a single decoder and trellis diagram.

In the following description, a "block code" can refer to any type of block code having a collection of codewords of a fixed length. For example, a CCK codeword can be one type of block code of length 8 thereby providing 256 possible combinations of codewords for high-rate CCK modulation. Other types of codewords are described below. Additionally, source information bits can be mapped to one codeword within a specific block code. For example, 8 bits of source information can be mapped to a high-rate CCK codeword, which can have up to 256 distinct codewords for high-rate CCK modulated codes.

Exemplary Block Codewords

The following implementations and examples are described for decoding block codes such as CCK codes and Barker sequence codes using a trellis diagram for each type of code. However, any type of block code can be decoded using a trellis diagram representing all possible combinations of codewords for that type of block code.

In the following description, a CCK codeword can be a block codeword having a code length of eight (8) at a chip rate of $f_{chip}$, and can be denoted as $c=(c_1, c_2, c_3, c_4, c_5, c_6, c_7, c_8)$ where $c_i$ represents the ith symbol of the CCK codeword c. Each symbol can represent a complex number. Nevertheless, the following implementations are not limited to a block codeword length of 8 and can be implemented for codewords having any block codeword length such that a trellis diagram is provided with a path for each possible combination of the codeword. The following formula can be used to derive the CCK codeword c at a 5.5 Mbit/s low-rate modulation and a 11 Mbit/s high-rate modulation:

$$c = (e^{j(\phi_1+\phi_2+\phi_3+\phi_4)}, e^{j(\phi_1+\phi_3+\phi_4)}, e^{j(\phi_1+\phi_2+\phi_4)}, -e^{j(\phi_1+\phi_4)}, e^{j(\phi_1+\phi_2+\phi_3)}, e^{j(\phi_1+\phi_3)}, -e^{j(\phi_1+\phi_2)}, e^{j\phi_1})$$

where $\phi_i$ for i=1,2,3,4 belong to quadrature phase-shift keying (QPSK) phases, i.e., $\phi_i \in \{0, \pi/2, \pi, 3\pi/2\}$ for i=1,2,3,4. Thus, there are two types of CCK modulation modes or types: high-rate CCK modulation and low-rate CCK modulation.

High-rate CCK Modulation

For high-rate CCK modulation, 8 information bits ($d_0$ to $d_7$) are carried by each transmitted codeword. In this manner, 256 possible codeword combinations can be modulated in a signal. The codewords can be generated by having $\phi_1$, $\phi_2$, $\phi_3$, and $\phi_4$ range over all possible QPSK phases, i.e., $\phi_i \in \{0, \pi/2, \pi, 3\pi/2\}$, for i=1,2,3,4. The four phases $\phi_1$, $\phi_2$, $\phi_3$, and $\phi_4$ can be encoded by the 8 information bits $d_0$ to $d_7$. For example, $\phi_1$ may be encoded from ($d_0, d_1$) based on the DQPSK modulation scheme, and $\phi_2$, $\phi_3$, and $\phi_4$ may be encoded from ($d_2, d_3$), ($d_4, d_5$), and ($d_6, d_7$), respectively, based on the QPSK modulation scheme.

Low-rate CCK Modulation

For the low-rate CCK modulation, 4 information bits ($d_0$ to $d_3$) can be carried by each transmitted codeword. In this manner, 16 codeword combinations can be provided for low-rate CCK modulation. The 16 possible codewords can be generated with $\phi_1$, $\phi_2$, $\phi_3$, and $\phi_4$ ranging the possible phases specified by the following phase values:

$\phi_1 \in \{0, \pi/2, \pi, 3\pi/2\}$ $\phi_2 \in \{\pi/2, 3\pi/2\}$ $\phi_3 = 0$ $\phi_4 \in \{0, \pi\}$ The four phases $\phi_1$, $\phi_2$, $\phi_3$, and $\phi_4$ are encoded by the 4 information bits $d_0$ to $d_3$. For example, $\phi_1$ may be encoded from ($d_0, d_1$) based on DQPSK modulation, and $\phi_2$, $\phi_3$, and $\phi_4$ can be encoded from ($d_2, d_3$) based on the following equations:

$\phi_2 = (d_2 \times \pi) + \pi/2$ $\phi_3 = 0$ $\phi_4 = d_3 \times \pi$

Thus, each CCK codeword can include 8 complex pulses ("chips") to carry 8 bits of information at a high-rate of 11 Mbit/s for transmitting the source data. At a low-rate of 5.5 Mbit/s, 4 bits of information can be mapped to the CCK codeword for transmitting the source data.

Phase Representation

The set of all possible phases $\Omega = \{0, \pi/2, \pi, 3\pi/2\}$ for a CCK codeword can be represented as a set of integers $Z_4 = \{0,1,2,3\}$. The mapping from $Z_4$ to $\Omega$ can then be defined as $\lambda(u) = u\pi/2$, for $u \in Z_4$. A phase addition is then equivalent to a modulo-4 addition in $Z_4$. If the following is set for $u_1$ to $u_4$, $u_1 = 2\phi_1/\pi$ $u_2 = 2\phi_2/\pi$ $u_3 = 2\phi_3/\pi$ $u_4 = 2\phi_4/\pi$ then $u_1, u_2, u_3, u_4 \in Z_4$. In such a manner, a CCK codeword can be represented as:

$$c = (e^{jp_1}\pi/2, e^{jp_2}\pi/2, e^{jp_3}\pi/2, e^{jp_4}\pi/2, e^{jp_5}\pi/2, e^{jp_6}\pi/2, e^{jp_7}\pi/2, e^{jp_8}\pi/2)$$

where $p = (p_1, p_2, p_3, p_4, p_5, p_6, p_7, p_8)$ is the phase representation of the codeword and can be determined by:

$$p = (u_1, u_2, u_3, u_4) \begin{bmatrix} 11111111 \\ 10101010 \\ 11001100 \\ 11110000 \end{bmatrix} + (0, 0, 0, 2, 0, 0, 2, 0)$$

where all the additions are modulo-4 additions.

Barker Sequence Code Modulation

The following implementations can be used to modulate codes using a Direct Sequence Spread Spectrum (DS-SS) modulation technique in which user data can be represented by a sequence of pulses or "chips" at a much higher chip rate than the original data bits. For DS-SS, and 11-chip Barker sequence can be used according to DQPSK and DBPSK modulation techniques. The Barker sequence can be formed using the following sequence codes:

+1, −1, +1, +1, −1, +1, +1, +1, −1, −1, −1

The leftmost chip "+1" can be outputted first in time. For example, the first chip can be aligned at the start of a transmitted DQPSK or DBPSK signal in which the signal period is 11 chips. The modulated Barker sequence can represent a "Barker codeword." For DQPSK modulation, there are four possible Barker codeword combinations, which are as follows:

(+1, −1, +1, +1, −1, +1, +1, +1, −1, −1, −1)

(+j, −j, +j, +j, −j, +j, +j, +j, −j, −j, −j)

(−1, +1, −1, −1, +1, −1, −1, −1, +1, +1, +1)

and for DBPSK modulation there are two possible Barker codeword combinations, which are the first and third codewords as shown above.

The above block codes for CCK codewords and Barker codewords can be represented in separate or combined trellis diagrams, which is described in further detail below. The decoder described herein can decode CCK codewords and Barker codewords contained or embedded in a received signal using one or more trellis diagrams.

Exemplary Communication System

FIG. 1 illustrates an exemplary block diagram of a transmitter 50 and a receiver 100 in which the invention can be implemented. The transmitter 50 and receiver 100 can be implemented for CCK codes and Barker sequence modulated codes. The transmitter 50 includes a block code encoder 20, signal processing logic 30, and radio frequency (RF) transmitter 40.

Referring to FIG 1. the block code encoder 20 receives data bits from a message source 10 and can encode the data bits into a low or high-rate CCK codeword or a DQPSK or DBPSK Barker sequence codeword for modulation in a carrier signal. The encoder 20 can use, e.g., the above formulas to encode the data bits into a CCK codeword c having eighty symbols (i.e., complex numbers) represented as $(c_1, c_2, c_3, c_4, c_5, c_6, c_7, c_8)$ for low and high-rate CCK codewords, or into one of the four Barker sequence codewords for DQPSK modulation or one of the two Barker sequence codewords for BBPSK modulation.

The encoder 20 can output two symbols ($c_{2k-1}$ and $c_{2k}$) of a codeword, which can by symbols for even and odd phases of the codeword. The encoder 20 is described in further detail regarding FIG. 8. The signal processing logic 30 can include any number of processing logic to convert the individual symbols into an analog component and to generate a carrier signal for modulating the block codeword having signal properties derived from the analog components. The RF transmitter 40 amplifies the carrier signal for transmitting the signal to the receiver 100. For a CCK codeword, the carrier signal can be modulated and transmitted, e.g., at a high-rate of 11 Mbit/s or a low-rate 5 Mbit/s in accordance with the requirements of IEEE 802.11b for WLANs.

Figure 2:
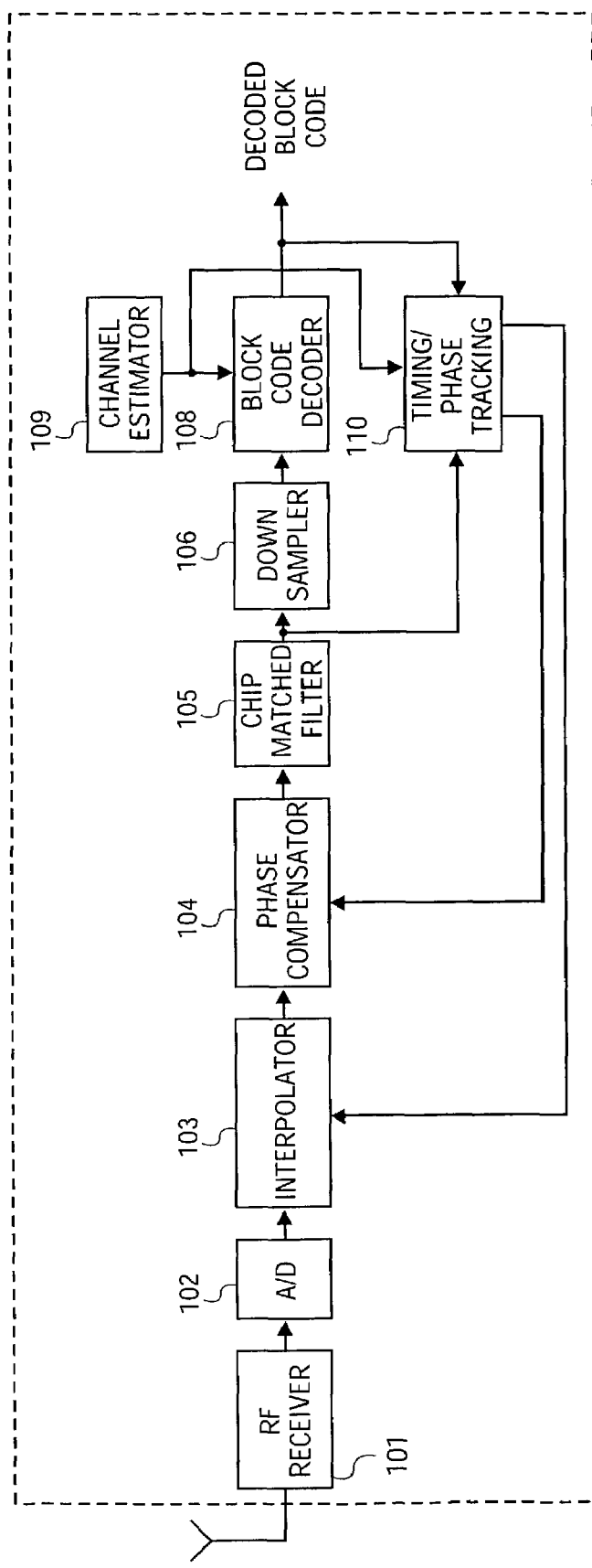
FIG. 2 illustrates one example detailed block diagram of the receiver in FIG. 1.

FIG. 2 illustrates a detailed block diagram of the receiver 100 of FIG. 1. The receiver 100 includes a RF receiver 101, analog-to-digital (A/D) converter 102, interpolator 103, phase compensator 104, chip matched filter 105, down sampler 106, block code decoder 108, channel estimator 109, and timing/phase tracking module 110.

Referring to FIG. 2, the RF receiver 101 receives the modulated carrier signal from the RF transmitter 40 of the transmitter 50. The receiver 101 can receive a carrier signal being modulated with CCK codes or Barker sequence codes, as described above. The received signal from RF receiver 101 can be sampled by a free running clock (not shown).

Each sampled received signal can include an in-phase (I) component and a quadrature (Q) component, which can be represented by a complex number. For example, a received signal $r_n$ can be denoted as a sampled signal of r(t). The received signal $r_n$ can then be represented mathematically as $r_n = \text{Re}\{r_n\} + j\text{Im}\{r_n\}$, where the real part of $r_n$ represents the I component and the imaginary part represents the Q component.

The A/D converter 102 converts the received signal into a discrete-time digital signal for processing by interpolator 103. The interpolator 103 can compensate for timing drifts between a local sampling clock and a transmitted clock, and can operate at a rate $f_{sample}$. For example, if the timing difference between the two clocks is larger than a certain value, the interpolator 103 can adjust the sampling phase of the received signal so that the sampled point can be at proper positions. The resolution of the interpolator 103 can be configured for $T_{res} = T_{sample}/\mu$, where $\mu$ is a positive interger and $T_{sample} = 1/f_{sample}$. The output from interpolator 103 can be expressed approximately as $r(nT_{sample} + mT_{res})$, where m is an integer which is controlled by the timing/phase tracking module 110.

The phase compensator 104 compensates for a phase error $\Delta\theta$. The phase compensator 104 can operate at a rate $f_{sample}$. The phase error $\Delta\eta$ can be obtained from the timing/phase tracking 110, which is described in further detail below. In one example, a complex-number multiplier can be used to remove the phase error $\Delta\theta$ by multiplying the received signal $e^{-j\Delta\theta}$. The chip matched filter 105 operates as a finite-impulse response (FIR) filter for filtering the signal from the phase compensator 104, and can operate at rate $f_{sample}$. The down sampler 106, which can operate at a rate $f_{chip}$, down samples the signal from the chip matched filter 105 by a factor of R. This results in a signal with a sampling rate $f_{chip}$.

The block code decoder 108 receives the down sampled signal from the down sampler 106 for decoding codewords contained in the down sampled signal or received signal. The decoder 108, which can operate at a rate of $f_{chip}$, can decode CCK codewords and Barker codewords contained in the down sampled signal using a trellis diagram. As described in further detail below, a single trellis diagram can have embedded a plurality of trellis diagrams wherein each trellis diagram can be used for decoding a particular type of block code, e.g., low and high-rate CCK codes and DQPSK and DBPSK Barker codes. Accordingly, a single decoder 108 can be configured or a mode selected for decoding high-rate CCK codes, low-rate CCK codes, DQPSK Barker sequence codes, and DBPSK Barker sequence codes.

The timing/phase tracking module 110, which can operate at rate $f_{sample}$, tracks variations of both timing and phase errors. That is, because a sampling clock frequency is determined from a free running clock (not shown), timing drifts can occur between remote and local clocks during decoding or detection of blocks codes. Furthermore, due to frequency offset and random phase error, a received signal can suffer from a phase rotation in both constant and random fashions. The timing/phase tracking module 110 outputs a decision of the timing error back to the interpolator 103, which can cause the sampling phase of the interpolator 103 to move forward the sampling point m (e.g., increase m by 1) or move backward the sampling point m (e.g., decrease m by 1) or stay at the current point (e.g., m remains unchanged) with the resolution of $T_{res}$. The timing/phase tracking module 110 outputs a decision of the phase error back to the phase compensator 104, which can cause the current compensating phase to increase $\Delta\theta$, decrease $\Delta\theta$, or remain the same. To make such decisions, the timing/phase tracking module 110 uses decoded codewords from the block codeword decoder 108 and the output of the channel estimator 109, which provides the estimate of the channel impulse response.

Exemplary Trellis Diagrams

The following exemplary trellis diagrams represent trellis diagram for CCK codes and Barker sequence codes. Such exemplary trellis diagrams can be used to represent the set of all possible codeword combinations for a particular type of code. Data relating to the following trellis diagrams can be stored in one or more memory devices and used by decoder 108 to perform the decoding techniques described herein.

Each trellis diagram includes a plurality of paths traversing any number of branches between states in the trellis diagram. Each path from an initial state to a final state can represent a codeword combination. Thus, a trellis diagram can be provided for any number of paths to represent any number of codeword combinations. The trellis diagrams can also depict state transitions of a finite state machine with its state $s_k$ displayed at each time k. Each possible state transition from $s_{k-1}$ to $s_k$ is represented by a branch in the trellis diagram. As a result, a trellis diagram can provide a one-to-one correspondence between a path in the trellis diagram and a possible codeword combination.

High-rate CCK Trellis Diagram

Figure 3:
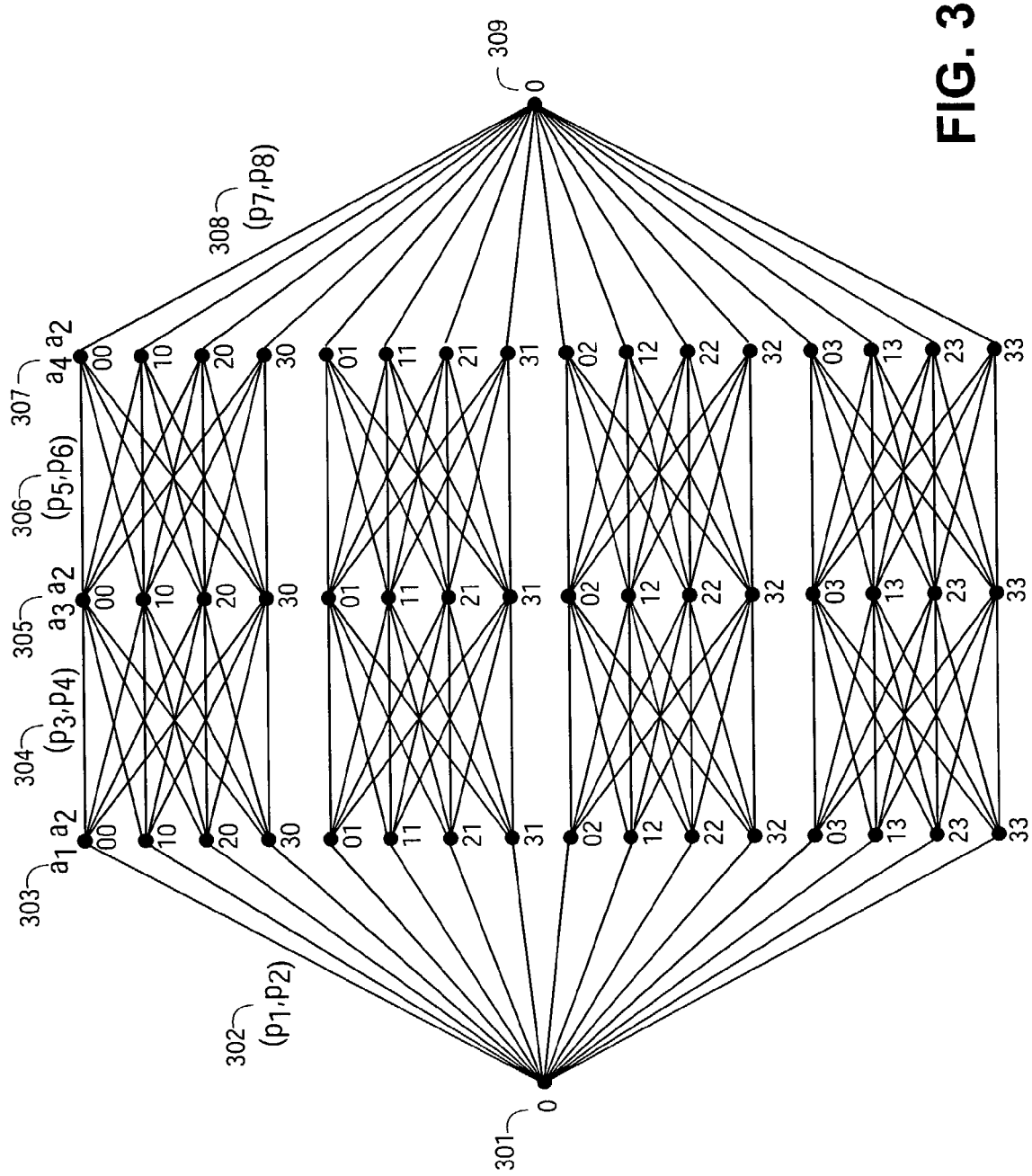
FIG. 3 illustrates an exemplary high-rate CCK trellis diagram.

FIG. 3 illustrates an exemplary high-rate CCK trellis diagram. This diagram represents possible high-rate CCK codeword combinations. In the example of FIG. 3, the values of $u_1, u_2, u_3$, and $u_4$ can take all four possible values in $Z_4$ in which 256 codeword combinations are possible for high-rate CCK modulation.

Referring to FIG. 3, the high-rate CCK trellis diagram contains four sections 302, 304, 306, 308 and each section can contain pairs of symbols of the CCK codeword. The first section 302 correspond to the phase representation $(p_1, p_2)$ of the codeword. The second section 304 corresponds to the phase representation $(p_3, p_4)$ of the codeword. The third section 306 corresponds to the phase representation $(p_5, p_6)$ of the codeword. The fourth section 308 corresponds to the phase representation $(p_7, p_8)$ of the codeword. Each branch in each section can represent two CCK codeword symbols. Thus, all paths starting from the left zero state 301 ("initial state 301") and terminating at the right zero state 309 ("final state 309") correspond to all the possible CCK codeword combinations. The trellis diagram in FIG. 3 can represent 256 distinct paths that start from the initial state 301 and terminate at the final state 309 for each possible high-rate CCK codeword combination.

The three intermediate states, $s_1, s_2,$ and $s_3$, (303, 305, and 307) can be represented as $s_1=(a_1, a_2)$, $s_2=(a_3, a_2)$, and $s_3=(a_4, a_2)$. The variables $a_1, a_2, a_3,$ and $a_4$ can be functions of $u_1, u_2, u_3,$ and $u_4$ and defined by:

$a_1 = u_1 + u_2 + u_3 + u_4$ $a_2 = u_2$ $a_3 = u_3$ $a_4 = u_1$ where all the additions are modulo-4 additions. There can be 16 possible values for each $s_k$, k=1,2,3, as indicated in FIG. 3. The initial state 301 is defined as $s_0=0$ (301) and the final state is defined as $s_4=0$ (309).

As shown in FIG. 3, each branch is labeled by two CCK symbols. For example, the branch between $s_0$ and $s_1$ is labeled by $(p_1, p_2)$ or equivalently $(c_1, c_2)=(e^{jp_1\pi/2}, e^{jp_2\pi/2})$. In this example, each branch is labeled by using phase representation. The branch label $(p_{2k-1}, p_{2k})$ on the branch between two states $s_{k-1}$ and state $s_k$ is a function of $s_{k-1}$ and $s_k$ for k=1,2,3,4. In particular, the functions can be represented as follows:

$(p_1,p_2)=(a_1,a_1+3a_2)$ $(p_3,p_4)=(a_1+3a_3,a_1+3a_2+3a_3+2)$ $(p_5,p_6)=(a_2+a_3+a_4,a_3+a_4)$ where all the additions are modulo-4 additions.

Low-rate CCK Trellis Diagram

Figure 4:
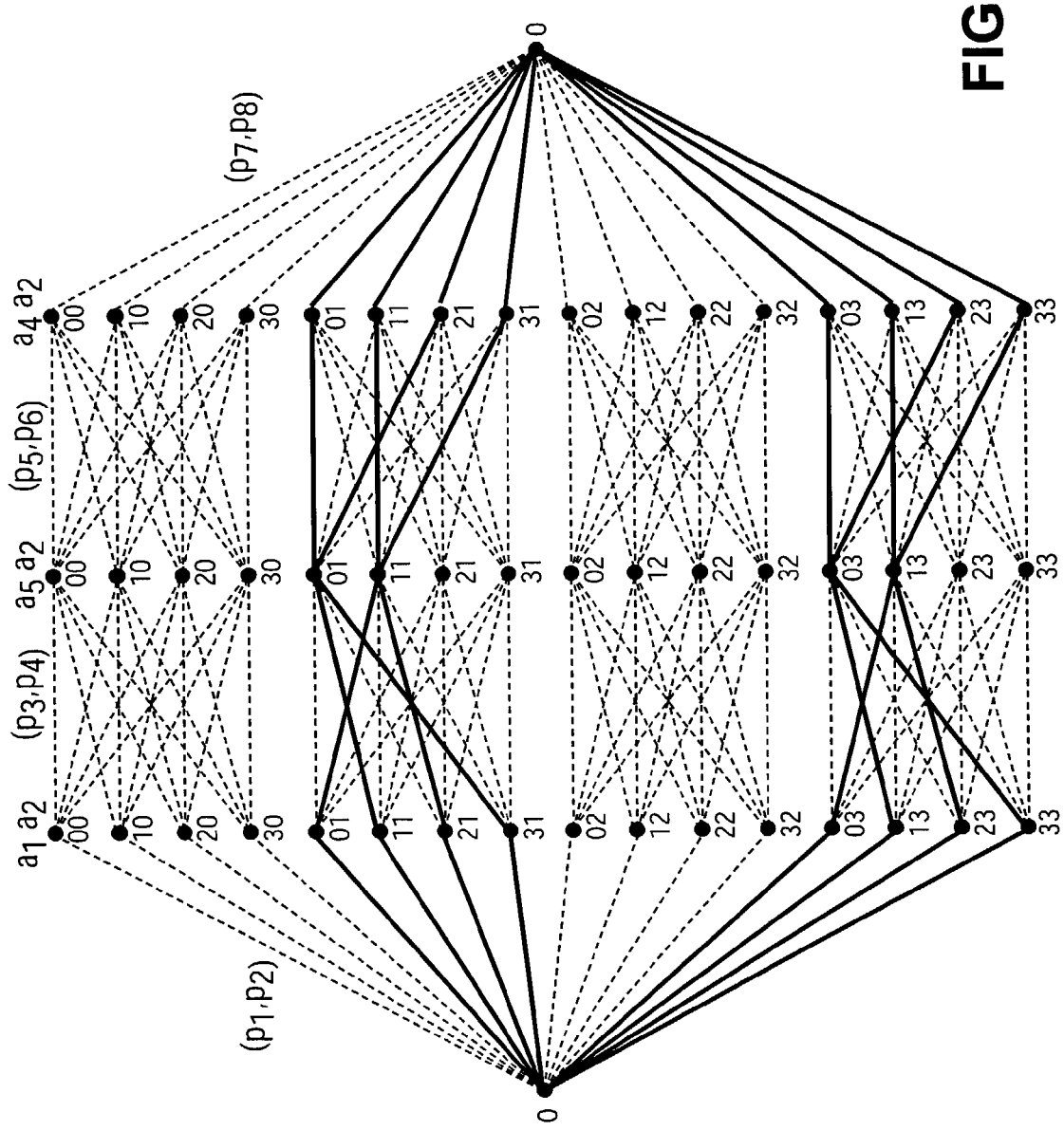
FIG. 4 illustrates an exemplary low-rate CCK trellis diagram.

FIG. 4 illustrates an exemplary low-rate CCK trellis diagram. This diagram represents possible low-rate CCK codeword combinations. In the example of FIG. 4, the values for $u_1, u_2, u_3,$ and $u_4$, can be represented as $u_1 \in \{0, 1,2,3\}$, $u_2 \in \{1, 3\}$, $u_3=0$, and $u_4 \in \{0,2\}$. This provides for 4×2×2=16 possible low-rate CCK codeword combinations. The three intermediate states, $s_1, s_2,$ and $s_3$ can be defined as $s_1=(a_1, a_2)$, $s_2=(a_5, a_2)$, $s_3=(a_4, a_2)$, where $a_1, a_2, a_4,$ and $a_5$ are functions of $u_1, u_2, u_3,$ and $u_4$, defined as:

$a_1 = u_1 + u_2 + u_3 + u_4$ $a_2 = u_2$ $a_4 = u_1$ $a_5 = (u_1 + u_3 + u_4)$ mode 2

Referring to FIG. 4, a low-rate CCK trellis diagram can be embedded in a high-rate trellis diagram as shown by the solid lines, which represent paths for the low-rate CCK codeword combinations. The branch label $(p_{2k-1}, p_{2k})$ on the branch between state $s_{k-1}$ and state $s_k$ is a function of $s_{k-1}$ and $s_k$ for k=1,2,3,4. For example, the branch labels can be determined as follows:

$(p_1,p_2)=(a_1,a_1+3a_2)$ $(p_3,p_4)=(a_a,a_1+3a_2+2)$ $(p_5,p_6)=(a_2+a_4,a_4)$ $(p_7,p_8)=(a_2+a_4+2,a_4)$.

As shown in FIG. 4, because the low-rate CCK trellis diagram can be embedded in the high-rate CCK trellis diagram, multi-mode decoding of codewords of different modulation modes can be implemented, as described in further detail below. For example, depending on the modulation mode for the codewords, certain states or branches can be disabled during decoding of the codeword. Thus, a decoder for decoding high-rate CCK codewords can also decode low-rate CCK codewords. The decoder can further be configured or a mode selected for decoding Barker codewords, as will be further described below.

Barker Sequence Trellis Diagrams

Figure 5A:
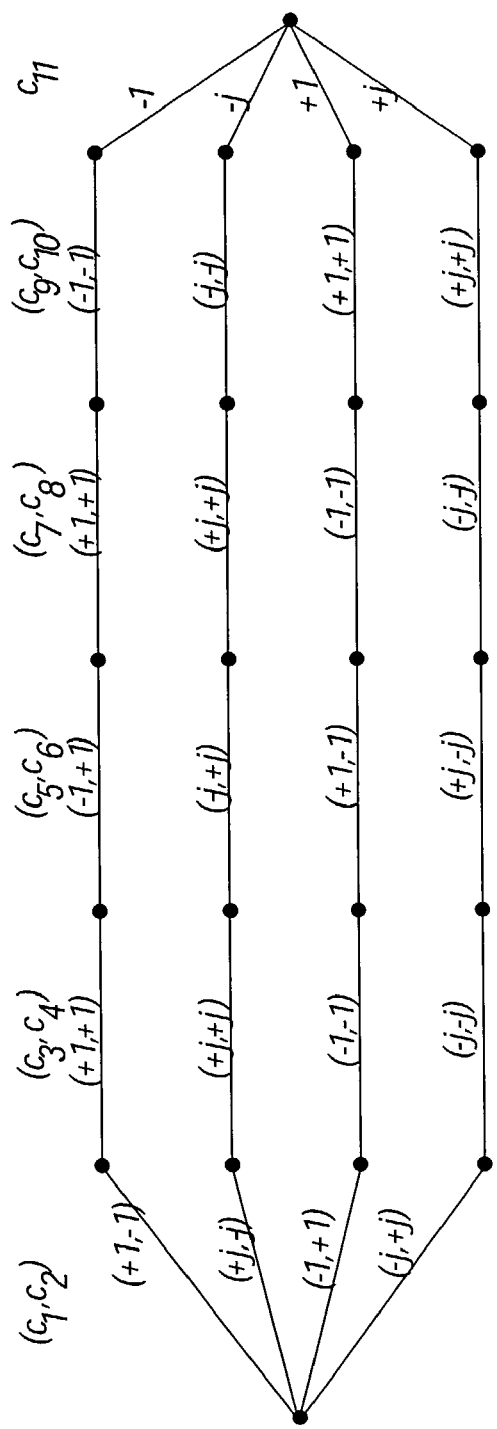
FIGS. 5A and 5B illustrate exemplary Barker sequence trellis diagram for DQPSK and DBPSK modulation, respectively.
Figure 5B:
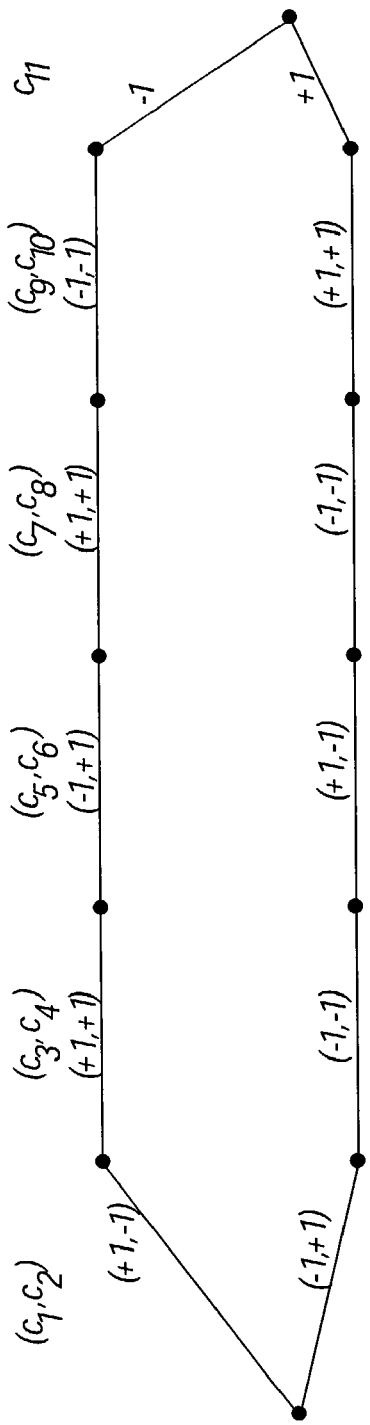

FIGS. 5A and 5B illustrate exemplary Barker sequence trellis diagrams for DQPSK and DBPSK modulation, respectively. The trellis diagrams shown in FIGS. 5A and 5B can also be embedded in a high-rate CCK trellis diagram such as that shown in FIG. 3 or 4. Accordingly, a single trellis diagram can be used for multiple types of codes in which the label on the branches for such a trellis diagram may correspond to different trellis diagrams for different types of codes. In the decoder, for example, a metric calculation can be performed for determining paths in the trellis diagram. This metric calculation can be the same for all types of codes.

As described above, the 11-chip Barker sequence used for DQPSK and DBPSK modulation are: +1, −1, +1, +1, −1, +1, +1, +1, −1, −1, −1. The four possible Barker codewords for DQPSK modulation is: (+1, −1, +1, +1, −1, +1, +1, +1, −1, −1, −1); (+j, −j, +j, +j, −j, +j, +j, +j, −j, −j, −j); (−1, +1, −1, −1, +1, −1, −1, −1, +1, +1, +1) and (−j, +j, −j, −j, +j, −j, −j, −j, +j, +j, +j). The two possible Barker codewords for DBPSK modulation are the first and third codewords of the possible codeword combination noted above.

The DQPSK and DBPSK Barker sequence trellis diagrams contain six sections. Each section can have two symbols and the last section can have one symbol. These Barker sequence trellis diagrams can be embedded in a high-rate CCK trellis diagram. As will be described in further detail below, a single decoder can be used to decode the different types of block codes using a single trellis diagram having paths for high and low-rate CCK codewords and Barker sequence codewords.

For the Barker sequence trellis diagrams, there are four disjoint paths for DQPSK modulation (FIG. 5A) and two disjoint paths for DBPSK modulation (FIG. 5B) that start from the left zero state ("initial state") and terminate at the right zero state ("final state") for DQPSK and DBPSK modulation, respectively. By extending the length of the high-rate CCK trellis diagram, the DQPSK and DBPSK Barker sequence trellis diagrams can be embedded into the high-rate CCK trellis diagram of FIG. 3 or 4.

Exemplary Decoding Algorithms

The following exemplary decoding algorithms can be implemented by decoder 108 in FIG. 1. As described in further detail below, the decoder 108 can decode CCK codes and Barker codes on additive white Gaussian noise (AWGN) channels, flat fading channels, and ISI channels. For purposes of explanation, the following algorithms are described with respect to CCK codes. Nevertheless, the following algorithms can be implemented for Barker sequence codes in the same manner.

Decoding Algorithm for AWGN Channels

The set of all possible CCK codewords can be denoted as C in which $\bar{c}=(\bar{c}_1,\bar{c}_2,\ldots,\bar{c}_8)$ can represent a transmitted CCK codeword. For AWGN channels, the received signal $y_n$ from the chip matched filter 105 can be expressed as $y_n = \bar{c}_n + \eta_n$ where $\eta_n$ is the additive white Gaussian noise.

To decode C, the decoder 108 can find a codeword c' in C that is "nearest" to the received signal $y_n$ based on a distance measurement such as, for example, the squared Euclidean distance of $$c' = \underset{c}{\operatorname{argmin}} \sum_{n=1}^{8} |y_n - c_n|^2.$$

In one example, the computation complexity for determining c' is approximately equal to |C|, where |C| denotes the number of codewords in C. This, however, requires evaluating 256 possible CCK codewords for high-rate CCK modulation by computing, e.g., the squared Euclidean distance between each CCK codeword and the received signal.

Such a process can be avoided by using a trellis diagram, e.g., the trellis diagram as shown in FIG. 3, and finding the minimum-distance path in the trellis diagram using Viterbi decoding techniques. For example, referring to FIG. 3, the variable $S_k$ can represent the set of all possible states $s_k$ in kth section of the CCK trellis diagram. Associated with each state $s_k \in S_k$, is a path metric $M_k(s_k)$ that is stored in a memory. This path metric can represent the minimum distance of the path and can be referred to as the "surviving path." The surviving path terminates at $s_k$ with the initial condition $M_0(s_0)=0$. In addition, for each state $s_k \in S_k$, the path information for the surviving path can be stored, which contains the labels associated with the branches on the surviving path. Then, for k=0,1,2,3, the path metric of state $s_{k+1}$ can be obtained as:

$$M_{k+1}(s_{k+1}) = \min_{\{s_k\} \mapsto s_{k+1}} (M_k(s_k) + B_k(s_k, s_{k+1})) \text{ for all } s_{k+1} \in S_{k+1}$$

The minimization determination is taken over all the possible proceeding states $\{s_k\}$ that connect to state $s_{k+1}$, and $B_k(s_k, s_{k+1})$ denotes the branch metric of the branch between state $s_k$ and state $s_{k+1}$ and is formed by summing a square of a magnitude of a first term and a square of a magnitude of a second term. The first term is the summation of a first received signal and a minus value of the first element of the branch label on the branch between $s_k$ and $s_{k+1}$. The second term is the summation of a second received signal and a minus value of the second element of the branch label on the branch between $s_k$ and $s_{k+1}$. Such an algorithm or process outputs the decoded block codeword stored in the surviving path that terminates at the right zero state $s_4$ in the CCK trellis diagram.

Decoding Algorithm for Flat Fading Channels

For flat fading channels, $\bar{c}=(\bar{c}_1,\bar{c}_2,\ldots,\bar{c}_8)$ represents the transmitted CCK codeword, and the received signal the chip matched filter 105 can be expressed as:

$$y_n = h^* \bar{c}_n + \eta_n$$

where h is a complex-value fading gain for the flat fading channel and $\eta_n$ is the additive white Gaussian noise, and "*" denotes a complex conjugate operator.

Referring to the trellis diagram of FIG. 3, the path metric of state $s_{k+1}$ can be obtained as:

$$M_{k+1}(s_{k+1}) = \min_{\{s_k\} \mapsto s_{k+1}} (M_k(s_k) + B_k(s_k, s_{k+1})) \text{ for all } s_{k+1} \in S_{k+1}$$

The minimization determination can be taken over all the possible proceeding states $\{s_k\}$ that connect to state $s_{k+1}$, and $B_k(s_k, s_{k+1})$ denotes the branch metric of the branch between state $s_k$ and state $s_{k+1}$ and is formed by summing a square of a magnitude of a first term and a square of a magnitude of a second term. The first term is the summation of the following items: a first received signal and a minus product of the first element of the branch label on the branch between $s_k$ and $s_{k+1}$ and an estimated fading gain. The second term is the summation of the following items: a second received signal and a minus product of the second element of the branch label on the branch between $s_k$ and $s_{k+1}$ and an estimated fading gain. This algorithm or process can output the CCK codeword stored in the surviving path that terminates at the right zero state $s_4$ in the CCK trellis diagram.

Decoding Algorithm for ISI Channels

For ISI channels, which can have intersymbol interference, the channel impulse response of the ISI channel can be represented as $h=(h_o, h_1, \ldots, h_k)$. The transmitted CCK code sequence can be represented as $\bar{x}=(\bar{c}_1, \bar{c}_2, \ldots, \bar{c}_Q)$ and each CCK codeword can be represented as $\bar{c}_l = (\bar{c}_{1,1}, \bar{c}_{1,2}, \ldots, \bar{c}_{1,8})$ for $l=1, \ldots, Q$, where Q denotes the number of consecutive CCK codewords. For ISI channels, the received signal can be expressed as:

$$y_n = \sum_{i=0}^{K} \bar{x}_{n-i} h_i^* + \eta_n$$

where $\eta_n$ represents the additive white Gaussian noise.

Figure 6:
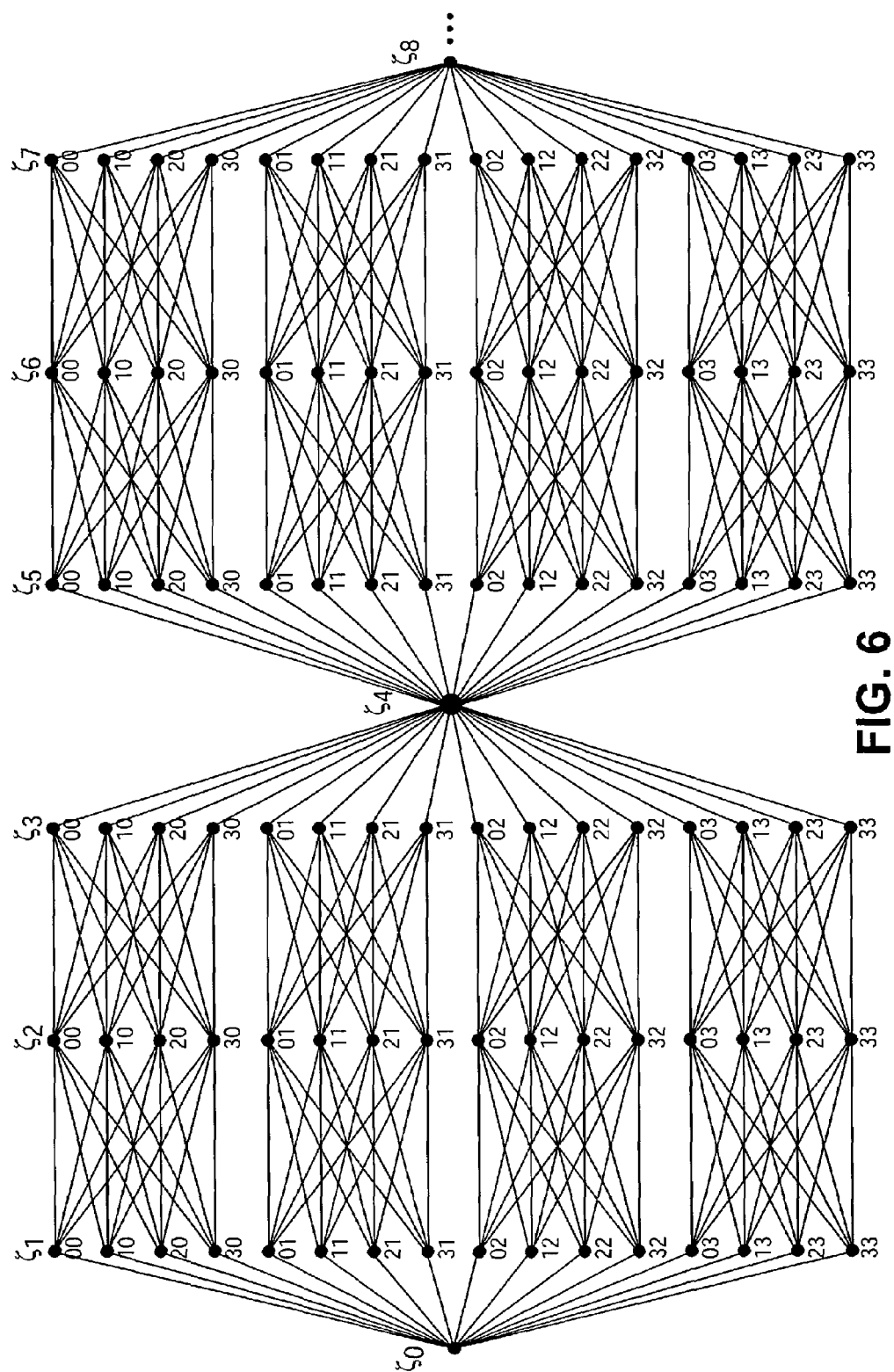
FIG. 6 illustrates exemplary concatenated trellis diagrams.

Since CCK codewords are transmitted consecutively, all possible super codewords $x=(c_1, c_2, \ldots, c_Q)$ can be determined from concatenated CCK trellis diagrams such as that shown in FIG. 6 using the decoding techniques described herein for each CCK trellis diagram.

Let $\xi_1, \xi_1, \ldots, \xi_{4Q}$ be the state sequence of the concatenated trellis. It is obvious that $\xi_k \in S_{(k \bmod 4)}$. Then, for $k=0,1,\ldots,4Q-1$, the path metric at the (k+1)th step can be updated as:

$$M_{k+1}(\xi_{k+1}) = \min_{\{\xi_k\} \to \xi_{k+1}} (M_k(\xi_k) + B_k(\xi_k, \xi_{k+1})) \text{ for all } \xi_{k+1} \in S_{(k+1 \bmod 4)}$$

The minimization determination can be taken over all the possible proceeding states $\{\xi_k\}$ that connect to $\xi_{k+1}$, and $B_k(\xi_k, \xi_{k+1})$ denotes the branch metric of the branch between state $\xi_k$ and state $\xi_{k+1}$ and is formed by summing a square of a magnitude of a first term and a square of a magnitude of a second term. The first term is the summation of the following items: a first received signal; a minus product of the first element of the branch label on the branch between $\xi_k$ and $\xi_{k+1}$ and a most recent channel estimation from the channel estimator; a minus sum of the products of the labels stored in the surviving path for the state $\xi_k$ and the channel estimation from the channel estimator. The second term is the summation of the following items: a second received signal and a minus product of the second element of the branch label on the branch between $\xi_k$ and $\xi_{k+1}$ and a most recent channel estimation from the channel estimator; a minus sum of the products of the labels stored in the surviving path and the channel estimation from the channel estimator 109.

For alternative implementations, the path and branch metrics for the above decoding algorithms can be obtained using path and branch metric algorithms described in issued U.S. Patent Application No. 10/227093, entitled "METHOD AND SYSTEM FOR DECODING BLOCK CODES BY CALCULATING A PATH METRIC ACCORDING TO A DECISION FEEDBACK SEQUENCE ALGORITHM," filed on Aug. 21, 2002.

Block Code Encoder

Figure 8:
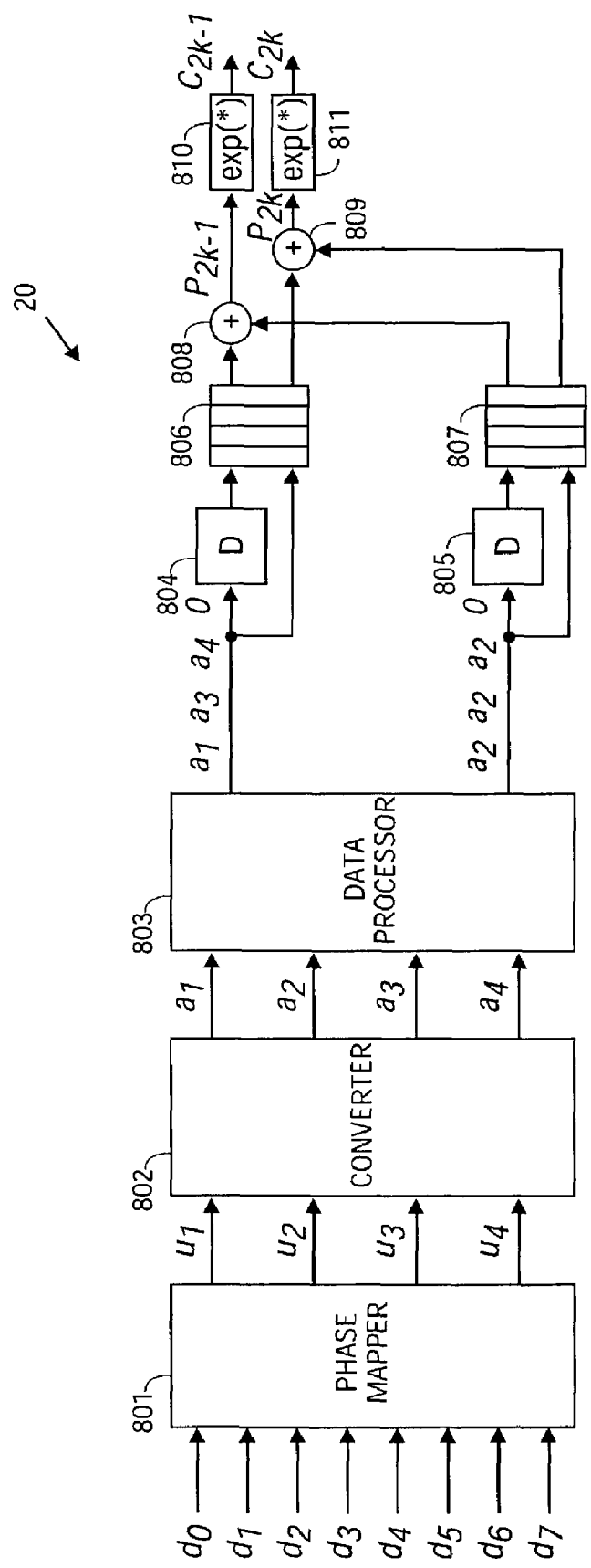
FIG. 8 illustrates one example detailed block diagram of the block code encoder of FIG. 1.

FIG. 8 illustrates one example detailed block diagram of the block code encoder 20 in FIG. 1. In the example of FIG. 8, the encoder 20 can represent a finite state machine to output two symbol components $c_{2k-1}$ and $c_{2k}$ that can be modulated in a carrier signal. These symbol components can be used with the trellis diagrams described above for decoder 108 to decode codewords contained in a received signal. The encoder 20 includes a phase mapper 801, converter 802, data processor 803, first and second delay elements 804 and 805, first and second coefficient operators 806 and 807, first and second adders 808 and 809, and first and second exponential operators 810 and 811.

The phase mapper 801 receives data bits $d_0, \ldots, d_7$ and maps the data bits into four phase representations $u_1, u_2, u_3$, and $u_4$, based on values for $\phi_1, \phi_2, \phi_3$, and $\phi_4$. The phase representations $u_1, u_2, u_3$, and $u_4$ can be determined as described above. The phase mapper 801 outputs the phase representations $u_1, u_2, u_3$, and $u_4$ to converter 802. The converter 802 converts the phase representations $u_1, u_2, u_3$, and $u_4$ into variables $a_1, a_2, a_3$, and $a_4$, which are outputted to the data processor 803.

The data processor 803 receives the variables $a_1, a_2, a_3$, and $a_4$ and processes them to output the variables in a selective order. For example, the data processor 803 can output a first sequence of variables in the order $(a_1, a_3, a_4, 0)$ to a first delay element 804 and first coefficient operator 806 and a second sequence of variables in the order $(a_2, a_2, a_2, 0)$ to a second delay element 805 and second coefficient operator 807. As described above, these variables describe intermediate states of a trellis diagram and be functions of $u_1, u_2, u_3$, and $u_4$, which are used to determine odd-phase and even-phase representations $p_{2k-1}$ and $p_{2k}$, respectively, of an encoded codeword.

The first delay element 804 receives and delays the first sequence of variables $(a_1, a_3, a_4, 0)$. Initially, the output of the first delay element 804 is set to zero. The second delay element 805 receives and delays the second sequence of variables $(a_2, a_2, a_2, 0)$. Initially, the output of the second delay element 805 is set to zero. The first coefficient operator 806 receives the delayed first sequence of variables from the first delay element 804 and the first undelayed sequence of variables from the data processor 803. The first coefficient operator 806 performs a mapping function to transfer the first delayed sequence of variables and the first undelayed sequence of variables into a first delayed coefficient sequence and a first undelayed coefficient sequence based on the timing order of elements in the first delayed sequence of variables and first undelayed sequence of variables.

The second coefficient operator 807 operates in the same manner as the first coefficient operator 806 except for processing the second delayed and undelayed sequence variables to perform a mapping function to transfer the second delayed sequence of variables and the second undelayed sequence of variables into a second delayed coefficient sequence and a second undelayed coefficient sequence based on the timing order of element sin the second delayed sequence of variables and the second undelayed sequence of variables.

The first adder 808 sequentially adds the first delayed coefficient sequence with the second delayed coefficient sequence to produce and output the odd-phase representations $p_{2k-1}$ of an encoded codeword. The second adder 809 sequentially adds the first undelayed coefficient sequence with the second undelayed coefficient sequence to produce and output even-phase representations $p_{2k}$ of the encoded codeword. The phase representations ($p_{2k+1}, p_{2k}$) can be transformed to the signal format using the transformation of $(c_{2k-1}, c_{2k}) = (e^{jpsk-1\pi/2}, e^{jpsk\pi/2})$. The first exponential operator 810 receives the odd-phase representation $p_{2k-1}$ from the first adder 808 and generates exponential values of each of the odd-phase representations as odd elements $c_{2k-1}$ for the encoded codeword. The second exponential operator 811 receives even-phase representation $p_{2k}$ and generates exponential values of each of the even-phase representations as even elements $c_{2k}$ for the encoded codeword.

Exemplary Decoder Hardware Architecture

Figure 7:
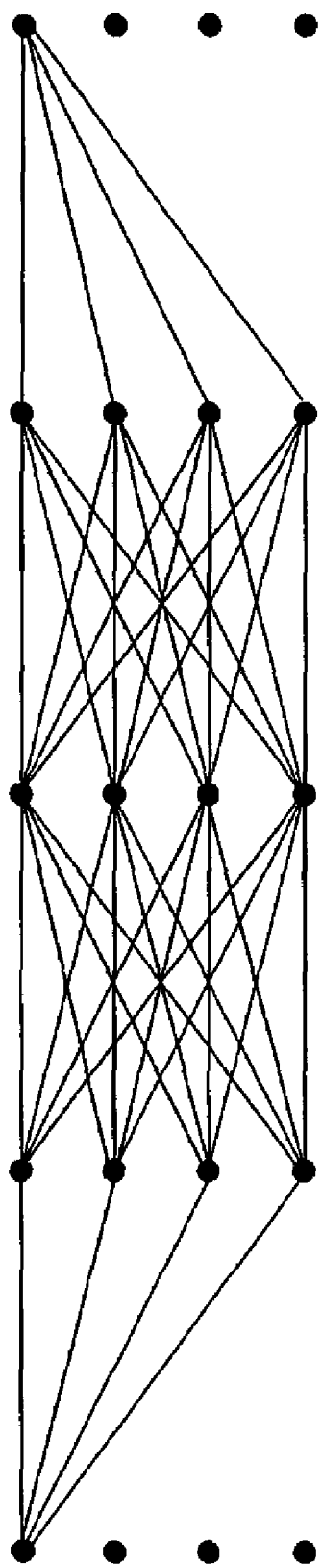
FIG. 7 illustrates an exemplary subtrellis diagram.
Figure 9:
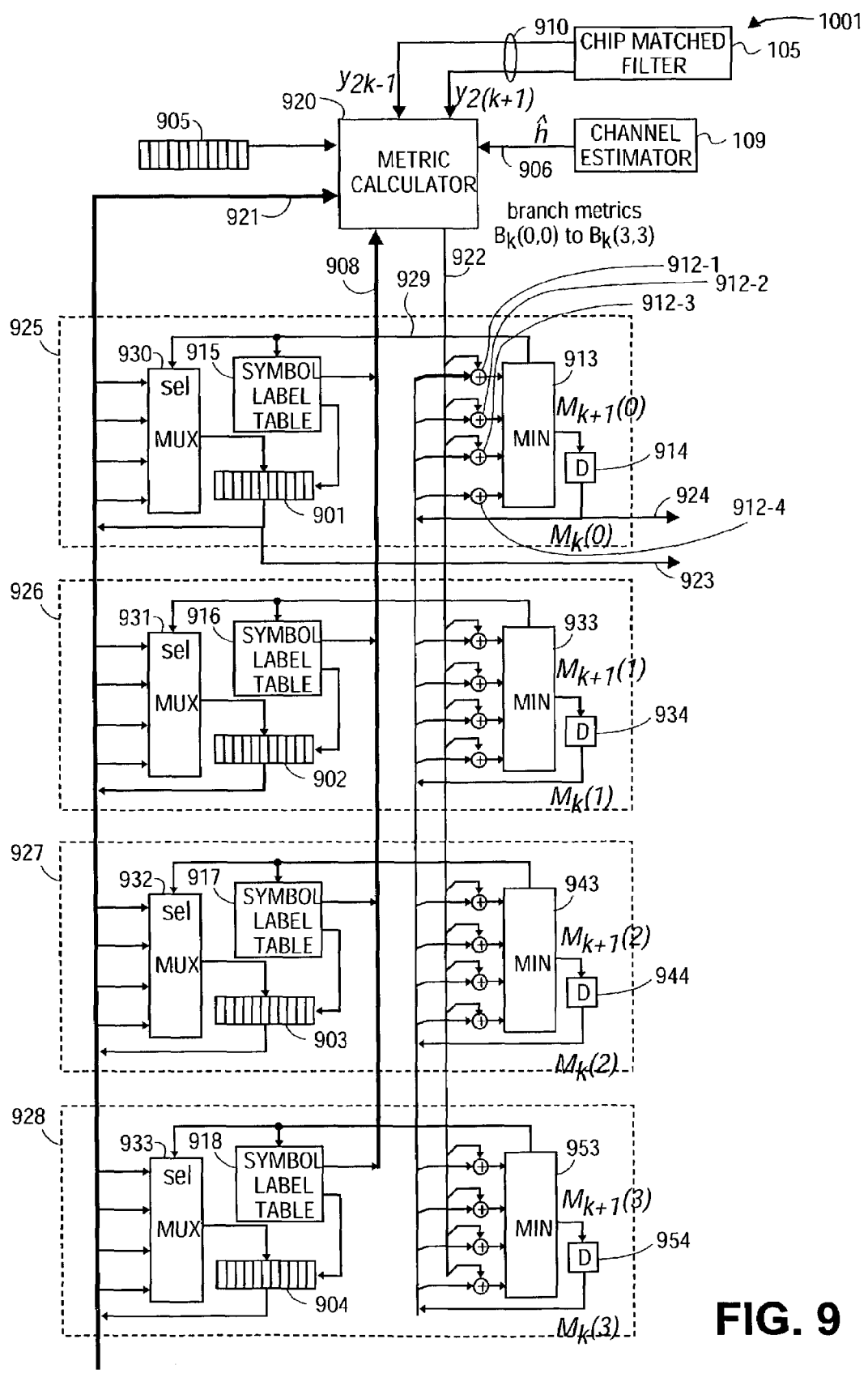
FIG. 9 illustrates an exemplary block diagram of a subdecoding unit for the subtrellis diagram of FIG. 7.
Figure 10:
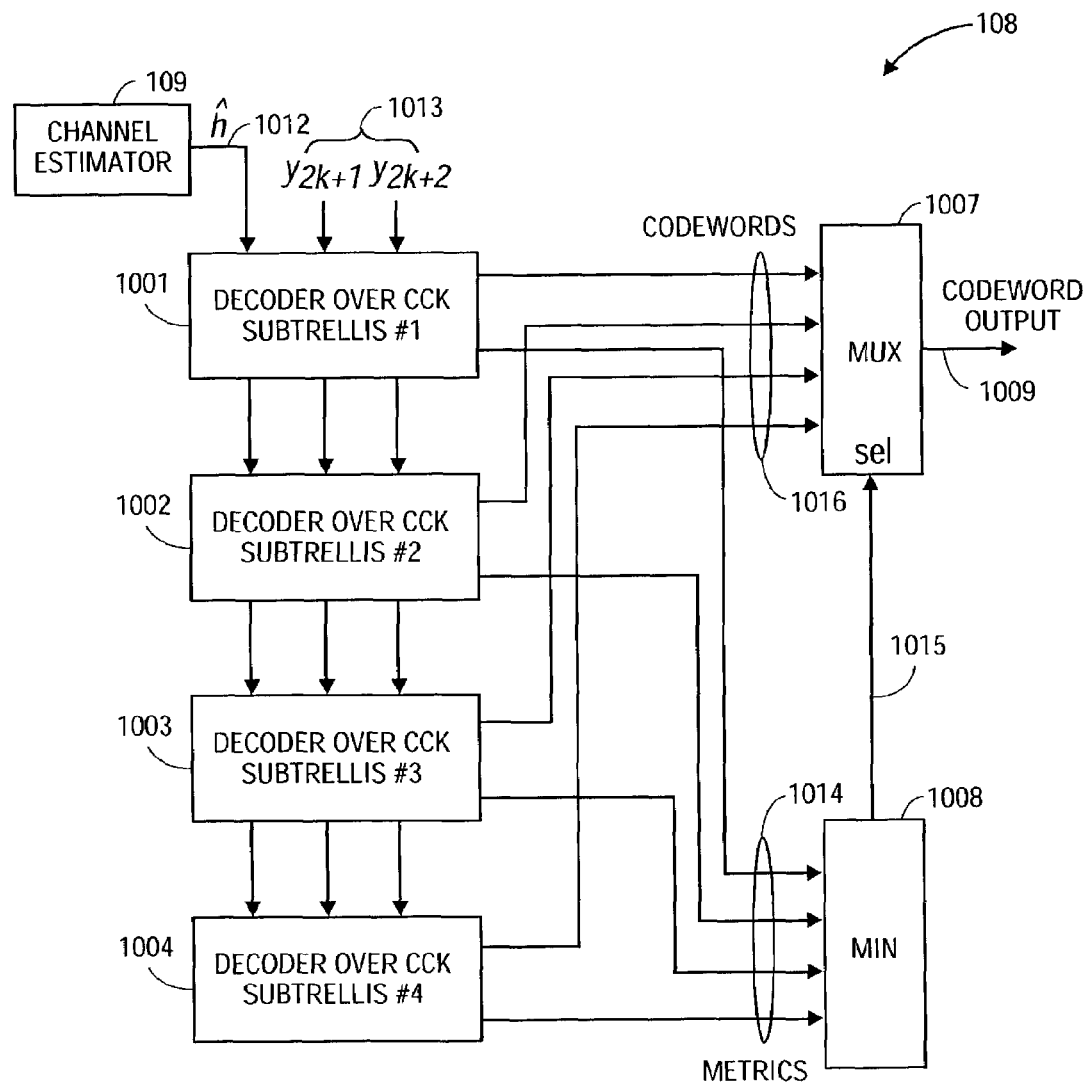
FIG. 10 illustrates an exemplary block diagram of the decoder in FIG. 1 for decoding CCK codewords over multiple subtrellis diagrams.
Figure 11:
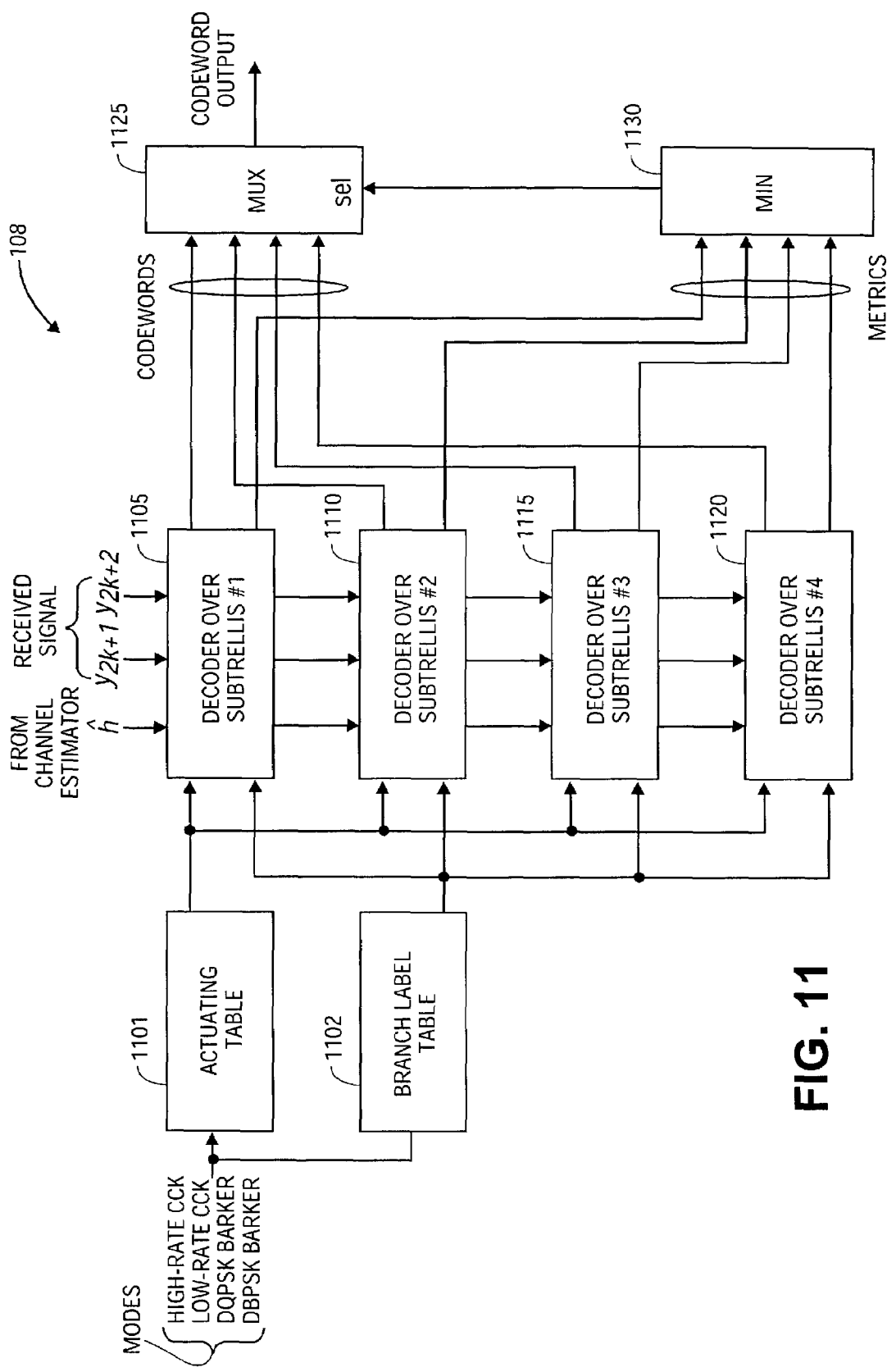
FIG. 11 illustrates an exemplary block diagram of the decoder of FIG. 1 for decoding CCK codewords and Barker sequence codewords over multiple subtrellis diagrams.

FIG. 9 illustrates an exemplary block diagram of a subdecoding unit for the subtrellis diagram of FIG. 7. The subdecoding unit can represent the internal components for a decoder over a subtrellis #N as shown in FIG. 10 or 11. The subdecoding unit can determine a path within a subtrellis diagram, which can be used for providing a codeword for the subtrellis diagram. Referring to FIG. 10, for example, the subdecoding unit of FIG. 9 can be implemented within each of the decoder over a CCK subtrellis #1 (1001) to decoder over CCK subtrellis #4 (1004). Furthermore, the subtrellis diagram of FIG. 7 can be embedded in a trellis diagram such as that shown in FIG. 3.

Referring back to FIG. 3, the CCK trellis diagram can have four disjoint subtrellis diagrams for decoding CCK codewords using the algorithms noted above. Regarding the disjoint subtrellis diagrams, there is no connection between the subtrellis diagrams except for the initial state and the final state. The four subtrellis diagrams are identical to the subtrellis diagram shown in FIG. 7 except for the labels on the branches. Thus, each of the decoder over a CCK subtrellis #1 (1001) to decoder over CCK subtrellis #4 (1004) in FIG. 10 can be used to decode a codeword over a respective subtrellis diagram that can be embedded within a single trellis diagram.

Referring to FIG. 9, a decoder over a CCK subtrellis #N (representing any of the decoders in FIG. 10) includes four submodules 925, 926, 927, and 928. Each of these submodules can be identical to perform algorithms described herein with respect to a respective subtrellis diagram. Additionally, each of the submodules can output a codeword or codeword candidate. In one example, one of the outputs from the submodules can be chosen as the decoded for a respective subtrellis diagram. The four states in the subtrellis diagrams are indexed by integers 0, 1, 2, and 3. The surviving paths are stored in a bank of registers and register exchanges are performed for surviving path updating. Since a codeword decision is made whenever a zero state is reached, i.e., whenever k=0 (mod 4), the tails of all the surviving paths are exactly the same as they first cross the zero state. This part of the surviving paths is called state-independent surviving path.

As shown in FIG. 9, a register bank 905 stores the state-independent surviving path and a plurality of register banks 901, 902, 903, and 904 store a path representing a codeword in the CCK trellis diagram. The metric calculator 920 receives previously decoded codewords from a state-independent register bank 905, received signals 910 from the chip matched filter 105, fading gains ĥ 906 from channel estimator 109, surviving paths 921 from register banks 901, 902, 903, and 904, and symbol labels 908 from symbol label tables 915, 916, 917, and 918.

In the case of k=0 (mod 4), the decoder 1001 delivers the surviving path stored in the zero state as the decoded codeword 923 and outputs the corresponding branch metric 924 in the zero state. The metric calculator 920 outputs sixteen branch metrics 922, $B_k(0,0)$, $B_k(1,0)$, $B_k(2,0)$, $B_k(3,0)$, ..., for the branches in the trellis section from k to k+1.

There are four submodules 925, 926, 927, and 928, and can be state processing units ("state processing units 925 to 928"). Each state processing unit includes four adders. For example, state processing unit 925 includes adders 912-1, 912-2 912-3 and 912-4. Each adder (e.g., 912-n) receives a selected one of the sixteen branch metrics, and selected one of the four path metrics of the previous states. Each adder adds the selected branch metric and selected path metric for generating a sum value of the two input items and outputs a sum value. The minimum value selector (e.g., selector 913) receives the sum values from the four adders and determines a minimum value from the inputs as the path metric for the state in question. The selector 913 also determines a symbol index 929 indicating the branch label having the minimum value.

The delay element (e.g, 914) receives the path metric from the minimum value selector 913 and stores the path metric. The delay element 914 also outputs the delayed path metric. The symbol label table (e.g., 915) receives the symbol index from the minimum value selector 913 and determines the first element and second element of the branch label on the specified branch. The path selector (e.g., 930) receives a plurality of surviving paths from the plurality of register banks 901, 902, 903, and 904 and the symbol index 929 from the minimum value selector 913 for updating the surviving path for the state in question. The state-independent register bank 905 receives the decoded codewords for storing decoded codewords and outputs the decoded codewords.

FIG. 10 illustrates an exemplary block digram of the decoder 108 in FIG. 1 for decoding codewords over multiple subtrellis diagrams. In the example, decoder 108 includes four decoders 1001, 1002, 1003, and 1004. For of these decoders corresponds to an individual subtrellis diagram. For example, decoder 1001 uses a first trellis diagram (CCK subtrellis #1) for decoding CCK codewords. The subtrellis diagrams can be a subtrellis diagram as shown in FIG. 7. The outputs from the decoders 1001 to 1004 can be selected as the decoded CCK codeword base don a smallest metric value.

Referring to FIG. 10, each of the decoders 1001 through 1004 ("CCK subtrellis decoders") receive signal 1013 and estimated channel impulse value ĥ 1012 from a channel estimator 109. Each of the CCK subtrellis decoders 1001 to 1004 outputs a local minimum metric and a CCK codeword corresponding to local minimum metric measurement calculated by the minimum value determining unit 1008. The minimum value determining unit 1008 receives the local minimum metrics 1014 from the four CCK subtrellis decodes 1001 to 1004 and determines a global minimum metric. The global minimum metric is a minimum value of the local minimum metrics 1014. The minimum value determining unit 1008 outputs the corresponding codeword index 1015 to a selector of multiplexer 1007. The selector 1007 receives the CCK codewords 1016 corresponding to the local minimum metrics from the four CCK subtrellis decoders 1001 to 1004 and selects a CCK codeword 1009 based on the CCK codeword index 1015, which is outputted as the decoded CCK codeword.

Exemplary Decoder for CCK Codes and Barker Sequence Codes

FIG. 11 illustrates an exemplary block diagram of the decoder in FIG. 1 for decoding CCK codes and Barker sequence codes over multiple subtrellis diagrams. In the example of FIG. 11, a high-rate CCK trellis diagram is embedded with a low-rate CCK trellis diagram (e.g., as shown in FIG. 4), a DQPSK Barker sequence trellis diagram, and a DBPSK Barker sequence trellis diagram, as described above. For Barker sequence trellis diagrams as shown in FIGS. 5A and 5B, the length of the high-rate CCK trellis diagram of FIG. 3 can be extended such that the Barker sequence trellis diagrams can be embedded in it. For such a single trellis diagram with embedded trellis diagrams, the label on the branches may differ for different trellis diagrams. Additionally, the lengths of the CCK and the Barker trellis diagrams can be different. The metric calculations and updated can be the same for the different trellis diagrams.

Referring to FIG. 11, the decoder 108 includes four decoders over subtrellis #1 (1105) to subtrellis #4 (1120). The decoders 1105, 1110, 1115, and 1120 can be designated for decoding high-rate CCK codes, low-rate CCK codes, DQPSK Barker sequence codes, and DBPSK Barker sequence codes. These decoders can operate for different types of subtrellis diagrams by selectively enabling or disabling branches in the high-rate CCK trellis diagram corresponding to its associated subtrellis diagram embedded in the trellis diagram. For example, the decoders 1110 1120 can be designated for the low-rate CCK subtrellis diagram such that some state and branch operations are disabled.

As shown, the actuating table 1101 receives designating or selected decoding modes for determining states and branches with respect to the designated modes. The actuating table 1001 outputs actuating signals to actuate the states and branches for the designated mode. The branch label table 1102 receives the designated decoding modes and generates branch labels corresponding to different designated modes and outputs the appropriate branch labels. The decoders 1105 to 1120, selector 1125, and minimum value determining unit 1130 can operate as the same in FIG. 10.

Timing/Phase Tracking Module

Figure 12:
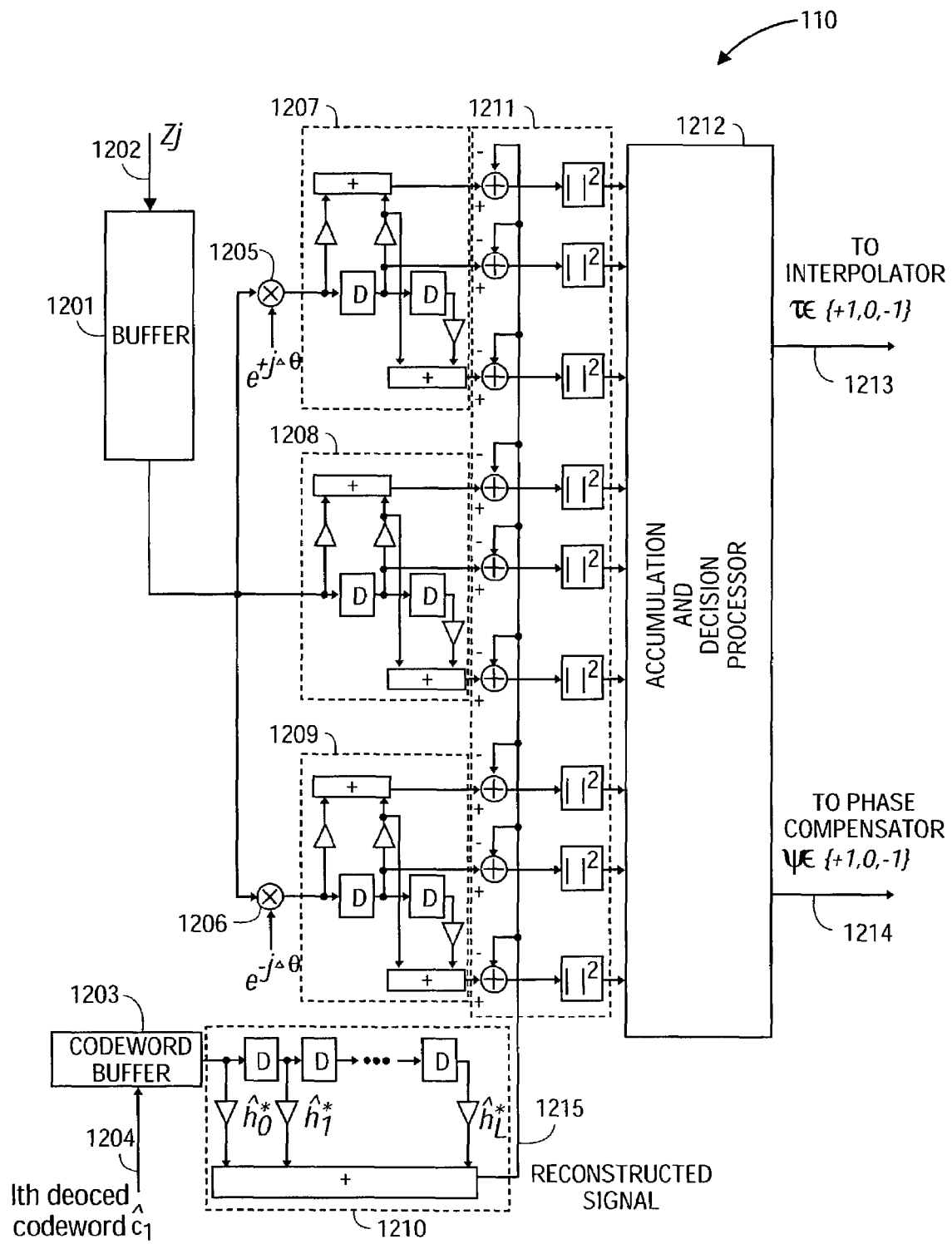
FIG. 12 illustrates one example block diagram of the timing/phase tracking module in FIG. 1.

FIG. 12 illustrates one example block diagram of the timing/phase tracking module 110 in FIG. 1. The timing/phase tracking module 110 operates as a device that performs metric tests on the received samples with the decoded codewords from the decoder 108. This testing function can be based on the metric calculations.

The metric tests requires $\lceil L/8 \rceil$ decoded CCK codewords or $\lceil L/11 \rceil$ decoded Barker codewords, where L is the length of the estimated channel impulse response. For purposes of explanation, the CCK modulation scheme is used, but the Barker sequence modulation scheme can also be used. If $v=\lceil L/8 \rceil$ and at some k with k≡0 (mod 4) and l=k/4, lth decoded CCK codeword is delivered from the decoder 108. The most recent v decoded codewords can be represented as $b=(b_1, b_2, \ldots, b_{8v})=(\hat{c}_{1-v+1}, \ldots, \hat{c}_1)$, where $b_i \in \{+1, -1, +j, -j\}$ and $\hat{c}_l$ is a decoded codeword. Let $\beta=2Rk$ and R is an over sampling factor. The received samples can have a sampling rate $T_{sample}$, which can be observed from the chip matched filter 105 up to $z_1, z_2, \ldots, z_\beta, z_{\alpha+1}$. The chip-rate sampled sequence up to β, denoted as $z_r, z_{2R}, \ldots, z_{\beta-r}, z_\beta$, is the input of the decoder 108 when the lth decoded block codeword is delivered.

The input samples to the decoder 108 should be estimated if the sampled timing is shifted by $+T_{res}$ and $-T_{res}$, respectively, where $T_{res}=T_{sample}/\mu$ is the resolution of timing tracking. Three 8-tuple test vectors y(+1), y(0), and y(−1) are formed by interpolating the received samples, with the qth elements as follows:

$$y_q(+1) = W_2 \cdot Z_{b-(8-q)R-1} + W_1 \cdot Z_{\beta-(8-q)R}$$

$$y_q(0) = Z_{\beta-(8-q)R}$$

$$y_q(-1) = W_1 \cdot Z_{62-(8-q)R-1} + W_2 \cdot Z_{\beta-(8-q)R+1}$$

for $q=1, \ldots, 8,$ and where $w_1$ and $w_2$ are the interpolation coefficients. The interpolated results $y(+1)$ and $y(-1)$ are simply the estimations of the input samples to the decoder 108 if the sampled timing are shifted by $+T_{res}$ and $-T_{res}$, respectively.

The estimated signals can be formed when the phases are shifted by $+\Delta\theta$ or $-\Delta\theta$. Therefore, the nine vectors that are generated are:

$$y'(+1,+1) = y(+1)e^{+j\Delta\theta}$$

$$y'(0,+1) = y(0)e^{+j\Delta\theta}$$

$$y'(-1,+1) = y(-1)e^{+j\Delta\theta}$$

$$y'(+1,0) = y(+1)$$

$$y'(0,0) = y(0)$$

$$y'(-1,0) = y(-1)$$

$$y'(+1,-1) = y(+1)e^{-\Delta\theta}$$

$$y'(0,-1) = y(0)e^{-j\Delta\theta}$$

$$y'(-1,-1) = y(-1)e^{-j\Delta\theta}$$

The nine vectors represent the estimates of the received signal to the decoder 108 with all the possible cases of timing and phase shifts. The metrics of all the received estimates are then evaluated. The metric of a received 8-tuple vector is given by:

$$T(y, b) = \sum_{q=1}^{8} \left| y_q - \sum_{i=0}^{L} b_{8(v-1)+q-i} \hat{h}_i^* \right|^2$$

where ĥ is the estimated channel impulse response. Substituting all the nine test vectors into the above equation, nine metrics $T(y'(m_1,m_2),b)$ for all $m_1, m_2 \in \{-1,0,+1\}$ are generated.

The timing/phase tracking module 110 makes a decision on timing adjustment after observing J metrics and makes a decision on phase adjustment after observing P metrics by accumulating the metric consecutively J and P times, respectively. The updating of the accumulated metrics can be expressed as:

$$\Lambda_i^{(t)}(m_1, m_2) \leftarrow \Lambda_{i-1}^{(t)}(m_1, m_2) + T(y^1(m_1, m_2), b) \text{ for } i=1, \ldots, J$$

$$\Lambda_i^{(p)}(m_1, m_2) \leftarrow \Lambda_{i-1}^{(p)}(m_1, m_2) + T(y^1(m_1, m_2), b) \text{ for } i=1, \ldots, P$$

for all $m_1, m_2 \in \{-1, 0, +1\}$. The final accumulated results of metrics for timing tracking and phase tracking are represented by $\Lambda^{(t)}_J(m_1, m_2)$ and $\Lambda^{(p)}_P(m_1, m_2)$, respectively.

For timing tracking, the timing/phase tracking module 110 finds one of the minimum value among $\Lambda^{(t)}_J(m_1, m_2)$ for all $m_1, m_2 \in \{-1, 0-1\}$. The result is then fed back to the interpolator 104 for adjusting the sample timing. For example, if $\Lambda^{(t)}_J(-1, *)$ attains the minimum, the timing/phase tracking module 110 sends a signal to the interpolator 103 to move the sample point one step backward. Denoting the output of the timing decision as $\tau$; the timing decision can be represented as:

$$\tau = \underset{m_1}{\operatorname{argmin}}\left(\underset{m_2}{\min} \Lambda_J^{(t)}(m_1, m_2)\right).$$

For phase tracking, the timing/phase tracking module 110 finds the one of the minimum values among $\Lambda^{(p)}_P(m_1, m_2)$ for all $m_1, m_2 \in \{-1, 0-1\}$. The result is then fed back to the phase compensator 104 to remove the phase error. For example, if $\Lambda^{(p)}_P(*, +1)$ attains the minimum, the timing/phase tracking module 110 sends a signal to the phase compensator 104 to increase the compensating phase by $+\Delta\theta$. Denoting the output of the phase decision as $\psi$, the phase decision can be represented as:

$$\psi = \underset{m_2}{\operatorname{argmin}}\left(\underset{m_1}{\min} \Lambda_P^{(p)}(m_1, m_2)\right)$$

It should be noted that all the values of $\Lambda^{(t)}_J(m_1, m_2)$ should be reset to zero whenever a timing decision is made, and all the values of $\Lambda^{(p)}_P(m_1, m_2)$ should be reset to zero whenever a phase decision is made.

The timing/phase tracking module 110 includes a buffer 1201 to account for the decoding delay of the decoder 108 for buffering data at the input of the received sample. Additionally, the buffer 1201 output is multiplied by $e^{+j\Delta\theta}$ and $e^{-j\Delta\theta}$, forming the estimated received samples with phase shifts $+\Delta\theta$ and $-\Delta\theta$, respectively. Generally, the three samples are fed into linear interpolators, forming the estimated samples of timing shift. At this stage, nine estimated samples are constructed as descried in further detail. The codeword is fed into a codeword buffer whenever the decoder 108 delivers a new decoded codeword. A reconstructed signal of the channel output is generated by passing the decoded codeword into FIR filter with coefficients ĥ. Finally, the reconstructed signal is subtracted from the nine estimated samples. The results are then squared and accumulated in the registers for final decisions of phase and timing adjustment.

Referring to FIG. 12, the timing/phase tracking module 110 includes a buffer 1201 that receives the received samples 1202 and a codeword buffer 1203 that receives the decoded codeword 1204 for buffering the decoded codeword and outputting the buffered decoded codeword to the summing processor 1210. A first multiplier 1205 receives the buffered received samples for positive rotating of received samples with a predetermined phase as positive rotated samples and outputs positive phase rotated samples. A second multiplier 1206 receives the buffered received samples for negative rotating of received samples with a predetermined phase as negative phase rotated samples and outputs the negative phase rotated samples.

First linear interpolators 1207 receives the positive phase rotated samples for forming three positive phase rotated timing/drift samples by interpolating from three selected consecutive positive phase rotated samples of the plurality of positive phase rotated samples, and outputs the positive phase timing-drift samples. Second linear interpolators 1208 receives the plurality of received samples for forming three phase non-rotated timing-drift samples by interpolating from three selected consecutive samples of the plurality of received samples, and outputs the three phase non-rotated timing-drift samples. Third linear interpolators 1209 receives the negative phase rotated samples for forming three negative phase rotated timing-drift samples by interpolating from three selected consecutive negative phase rotated samples of the plurality of negative phase rotated samples, and outputs the negative phase rotated timing-drift samples.

The summing processor 120 receives the previously decoded codewords and an estimated channel impulse response for summing the products of the decoded codewords and the estimated channel impulse response, and outputs a reconstructed signal 1215. Nine adding and squaring processors 1211 subtract the reconstructed signal from predetermined test vectors of three positive phase rotated timing-drift samples, three phase non-rotated timing-drift samples, and three negative phase rotated timing-drift samples from the first, second and third interpolators 1207, 1208, and 1209, respectively, and then square the magnitude of the subtracting result as a squared magnitude value. An accumulation and decision processor 1212 receives the squared magnitude values from the adding and squaring processor 1211 for accumulating the squared magnitude values, determining a timing shift responsive to a minimum of said accumulation, outputting said timing shift 1213. The accumulation and decision processor 1212 further determines a phase shift responsive to a minimum of said accumulation, and outputs the phase shift 1214.

In the above examples, the components for the above decoders can be implemented in hardware such as, for example, an application specific integrated circuit (ASIC) or a field programmable gate array (FPGA) to perform the block code decoding techniques described herein. Alternatively, the above components can be implemented in software in which a digital signal processor (DSP) and one or more memory devices can be used to implement the block code decoding techniques described herein. Additionally, the above decoders can be configured or programmed using a combination of hardware and software to implement the block code decoding techniques described herein.

Thus, a method and system for decoding block codes have been described. In the foregoing specification, the invention has been described with reference to specific exemplary implementations. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for decoding a received signal being modulated using one of a plurality of modulation based on a trellis diagram to output an decoded code, comprising:
a plurality of subdecoding units, each receiving a plurality of symbols of received signal, and an estimate of the channel impulse response for decoding the received signal to output a local minimum metric and a code corresponding to the local minimum metric based on a corresponding subtrellis in the trellis diagram,
a selector for selecting one of the codes from the plurality of subdecoding units as the decoded code based on an index signal,
a minimum value determining unit for receiving the local minimum metrics from the plurality of subdecoding units, and generating the index signal that indicates which local minimum metric is the minimum one among the local minimum metrics,
an actuating unit for receiving a mode indicating signal and determining states and branches in the subtrellis corresponding to each subdecoding unit, and
a branch label generating unit for receiving the mode indicating signal and generating a plurality of branch labels of the subtrellis corresponding to each subdecoding unit,
wherein the received signal contains at least one block code.

2. The apparatus of claim 1, wherein the mode indicating signals is used to indicate the modulation mode that can be one of a high-rate complementary code keying (CCK) modulation mode, low-rate CCK modulation mode, differential quadrature phase shift keying (DQPSK) Barker sequence modulation mode, and differential binary phase shift keying (DBPSK) Barker sequence modulation mode.

3. The apparatus of claim 2, wherein the number of the plurality of subdecoding units is 4.

4. The apparatus of claim 1, wherein each subdecoding unit comprises:
a plurality of submodules, each generating a delayed path metric, comprising:
a plurality of adders each adding a selected one of a plurality of branch metrics and a selected one of the delayed path metrics to generate a sum value;
a minimum value selector for selecting the sum values from the plurality of adders as a path metric and generating a label index that indicates the branch label corresponding to the path metric that is selected;
a delay unit for receiving and storing the path metric and outputting a delayed path metric;
a branch label table containing a plurality of label indexes and the corresponding branch labels; and
a surviving path updating unit for receiving the label index, the surviving path in each submodules, and the branch label corresponding to the label index obtained from the branch level table to update the surviving path of the present submodule; and
a metric calculator for receiving previously decoded codes, at least one symbols of received signal, the estimate of the channel impulse response, the surviving path of each submodule, and branch labels obtained from the branch label table in each submodule to generate the plurality of branch metrics respectively corresponding to a plurality of branches in the subtrellis;
wherein after the surviving path is updated for N iterations with N being an integer, the delayed path metric of a specific submodule is outputted as the local minimum metric and the surviving path of the specific submodule is outputted as the code corresponding to the local minimum metric.

5. The apparatus of claim 4, wherein the mode indicating signal is used to indicate the modulation mode that can be one of a high-rate complementary code keying (CCK) modulation mode, low-rate CCK modulation mode, differential quadrature phase shift keying (DQPSK) Barker sequence modulation mode, and differential binary phase shift keying (DBPSK) Barker sequence modulation mode.

6. The apparatus of claim 5, wherein the number of the plurality of submodules is 4.

7. The apparatus of claim 5, wherein if the mode indicating signal indicates the high-rate CCK modulation mode, the number N=4, the actuating unit activates 4 subdecoding units and determines states $s_0, s_1, s_3, s_3$ and $s_4$ sequentially from an initial state to a final state in the trellis diagram as:
$s_0=0$, $s_1=(a_1,a_2)$, $s_2=(a_3,a_2)$, $s_3=(a_4,a_2)$, and $s_4=0$
where $a_1, a_2, a_3$, and $a_4$ are functions of a set of number $u_i$ determined by
$a_1 = u_1+u_2+u_3+u_4$
$a_2 = u_2$
$a_3 = u_3$
$a_4 = u_1$
where the set of number $u_i$ are defined as $u_i \epsilon 55\ 0,1,2,3\}$ for i=1,2,3,4;
and the branch label generating unit generates the branch labels sequentially from the initial state to the final state as
$(p_1,p_2)=(a_1,a_1+3a_2)$
$(p_3,p_4)=(a_1+3a_3,a_1+3a_2+3a_3+2)$
$(p_5,p_6)=(a_2+a_3+a_4,a_3+a_4)$
$(p_7,p_8)=(a_2+a_4+2,a_4)$
where all additions are modulo-4 additions.

8. The apparatus of claim 5, wherein if the mode indicating signal indicates the low-rate CCK modulation mode, the number N=4, the actuating unit activates 4 subdecoding units and determines states $s_0, s_1, s_3, s_3$ and $s_4$ sequentially from an initial state to a final state in the trellis diagram as:
$s_0=0$, $s_1=(a_1,a_2)$, $s_2=(a_5,a_2)$, $s_3=(a_4,a_2)$, and $s_4=0$ where $a_1, a_2, a_4$, and $a_5$ are functions of a set of number $u_i$ determined by
$a_1 = u_1 u_2+u_3+u_4$
$a_2 = u_2$ for $u_1 \epsilon \{0,1,2,3\{$, $u_2 \epsilon \{1,3\}$, $u_3=0$, and $u_4 \epsilon \{0,2\}$;
$a_5 = (u_1+u_3+u_4) \bmod 2$
and the branch label generating unit generates the branch labels sequentially from the initial state of the final state as
$(p_1,p_2)=(a_1,a_1+3a_2)$
$(p_3,p_4(=(a_1,a_1+3a_2+2)$
$(p_5,p_6)=(a_2+a_4,a_4)$
$(p_7,p_8)=(a_2+a_4+2,a_4)$
where all additions are modulo-4 additions.

9. The apparatus of claim 5, wherein if the mode indicating signal indicates the DQPSK Barker sequence modulation mode, the number N=6, the actuating unit actives 4 subdecoding units, the branch label generating unit generates the branch labels sequentially from the initial state to the final state in the four subtrellises corresponding to the 4 subdecoding units respectively as
$(p_1,p_2)=(+1,-1)$, $(p_3,p_4)=(30\ 1,\ -1)$, $(p_5,p_6)=(-1,\ +1)$, $(p_7,p_8)=(+1,\ +1)$, $(p_9,p_{10})=(-1,-1)$, $(p_{11})=(-1)$,
$(p_1,p_2)=(+j,-j)$, $(p_3,p_4)=(+j,+j)$, $(p_5,p_6)=(-j+j)$, $(p_7,p_8)=(+j,+j)$, $(p_9,p_{10})=(-j,-j)$, $(p_{11})=(-j)$,
$(p_1,p_2)=(-1+1)$, $(p_3,p_4)=(-1,-1)$, $(p_5,p_6)=(+1,-1)$, $(p_7,p_8)=(-1,-1)$, $(p_9,p_{10})=(+1,+1)$, $(p_{11})=(+1)$, $(p_1,p_2)=(-j,+j)$, $(p_3,p_4)=(-j,-j)$, $(p_5,p_6)=(+j,-j)$, $(p_7,p_8)=(-j,-j)$, $(p_9,p_{10})=(+j+j)$, $(p_{11})=(+j)$.

10. The apparatus of claim 5, wherein if the mode indicating signal indicates the DBPSK Barker sequence modulation mode, the number N=6, actuating unit activates two subdecoding units, and the branch label generating unit generates the branch labels sequentially from the initial state to the final state in the two subtrellises corresponding to the two subdecoding units respectively as $(p_1,p_2)=(+1,-1)$, $(p_3,p_4)=(+1,+1)$, $(p_5,p_6)=(-1,+1)$, $(p_7,p_8)=(+1,+1)$, $(p_9,p_{10})=(-1,-1)$, $(p_{11})=(-1)$, $(p_1,p_2)=(-1,+1)$, $(p_3,p_4)=(-1,-1)$, $(p_5,p_6)=(+1,-)$, $(p_7,p_8)=(-1,-1)$, $(p_9,p_{10})=(+1,+1)$, $(p_{11})=(+1)$.

11. The apparatus of claim 1, wherein:
the received signal is received on at least one of an additive white Gaussian noise channel, flat fading channel, and intersymbol interference channel; and
the timing and phase of the received signal are tracked before decoding.

12. The apparatus of claim 1, further comprising a timing and phase tracking module to track timing and phase of the received signal.

13. A communication system, comprising:
a receiver, receiving a signal containing at least one block code of a fixed length,
wherein the block code is modulated in a mode selected from a plurality of modulation modes;
a decoder for decoding the signal using a trellis diagram comprising a plurality of subtrellises to output a decoded code, comprising:
a plurality of subdecoding units each corresponding to a subtrellis, decoding the signal based on an estimate of the channel impulse response to output a plurality of local minimum metrics and codes correspondingly;
a minimum value determining unit, coupled to the subdecoding units, determining a minimum local minimum metric among the local minimum metrics;
a selector, coupled to the subdecoding units, selecting a code associated with the minimum local minimum metric as the decoded code;
an actuating unit, determining states and branches in the trellis diagram based on the selected mode, and
a branch label generating unit, determining branch labels on the branches.

14. The communication system of claim 13, wherein the mode is one of high-rate CCK modulation mode, low-rate CCK modulation mode, DQPSK Barker sequence modulation mode, and DBPSK Barker sequence modulation mode.

15. The communication system of claim 14, wherein the selector further selects at least one among a high-rate CCK trellis diagram, a low-rate CCK trellis diagram, a DQPSK Barker sequence trellis diagram, and a DBPSK Barker sequence trellis diagram as the trellis diagram based on the mode.

16. The communication system of claim 14, wherein the subdecoding units decode the block code using a high-rate CCK trellis diagram, in which at least one of the low-rate CCK trellis diagram, DQPSK Barker sequence trellis diagram, and DBPSK Barker sequence trellis diagrams are embedded as part of the states and branches.

17. The communication system of claim 13, wherein the receiver receives the signal on at least one of an additive white Gaussian noise channel, flat fading channel, and intersymbol interference channel.

18. The communication system of claim 13, further comprising a timing and phase tracking module to track timing and phase of the signal.

19. The communication system of claim 13, further comprising an encoder, encoding input data in a high-rate CCK modulation mode to generate the signal, comprising:
a phase mapper to map input data into phase representations $u_1$, $u_2$, $u_3$, and $u_4$ based on phase values $\phi_1$, $\phi_2$, $\phi_3$, and $\phi_4$;
a converter to convert the phase representations $u_1$, $u_2$, $u_3$, and $u_4$ into variables $a_1$, $a_2$, $a_3$, and $a_4$ of a function representing the states of the trellis diagram;
a data processor to output the variables in a selective order; and
a processor logic to determine odd-phase and even-phase representations of a codeword required to modulate the signal based on the variables outputted from the data processor.

20. The communication system of claim 19, wherein the variables are defined as:
$a_1=u_1+u_2+u_3+u_4$
$a_2=u_2$
$a_3=u_3$
$a_4=u_1$.

21. A communication method, comprising:
receiving a signal containing at least one block code of a fixed length modulated in a mode selected from a plurality of modulation modes;
decoding the signal by a trellis diagram comprising a plurality of subtrellises to output a decoded code, comprising:
receiving an estimate of the channel impulse response;
determining whether to enable the subtrellises according to the selected mode;
decoding the signal by the enabled subtrellises to output a plurality of local minimum metrics and codes based on the estimate of the channel impulse response;
determining a minimum local minimum metric among the local minimum metrics;
determining states and branches in the trellis diagram based on the selected mode; and
determining branch labels on the branches.

22. The communication method as claimed in claim 21, wherein the mode is selected from at least one among a high-rate CCK modulation mode, a low-rate CCK modulation mode, a DQPSK Barker sequence modulation mode, and a DBPSK Barker sequence modulation mode.

23. The communication method as claimed in claim 22, wherein the trellis diagram is selected from at least one among a high-rate CCK trellis diagram, a low-rate CCK trellis diagram, a DQPSK Barker sequence trellis diagram, and a DBPSK Barker sequence trellis diagram.

24. The communication method as claimed in claim 23, wherein the trellis diagram is a high-rate CCK trellis diagram, in which at least one of the low-rate CCK trellis diagram DQPSK Barker sequence trellis diagram, and DBPSK Barker sequence trellis diagrams are embedded as part of the states and branches in the trellis diagram.

25. The communication method as claimed in claim 21, wherein reception of the signal comprises receiving the signal on at least one of an additive white Gaussian noise channel, flat fading channel, and intersymbol interference channel.

26. The communication method as claimed in claim 21, further comprising tracking timing and phase of the signal.

27. The communication method as carried in claim 21, further comprising to generating the signal by encoding an input data in a high-rate CCK modulation mode, and the encoding comprising:
  mapping the input data into phase representations $u_1$, $u_2$, $u_3$, and $u_4$, based on phase values $\phi_1$, $\phi_2$, $\phi_3$, and $\phi_4$;
  converting the phase representations $u_1$, $u_2$, $u_3$, and $u_4$ into variables $a_1$, $a_2$, $a_3$, and $a_4$ of a function representing the states in the trellis diagram;
  outputting the variables in a selective order to determine odd-phase and even-phase representations of a codeword required to modulate the signal.

28. The communication method as claimed in claim 27, wherein the variables are defined as:

$a_1 = u_1 + u_2 + u_3 + u_4$ $a_2 = u_2$ $a_3 = u_3$ $a_4 = u_1$

* * * * *